(12) United States Patent
Hsu et al.

(10) Patent No.: US 12,532,560 B2
(45) Date of Patent: Jan. 20, 2026

(54) ISOLATION STRUCTURE WITH MULTIPLE COMPONENTS TO INCREASE IMAGE SENSOR PERFORMANCE

(71) Applicant: Taiwan Semiconductor Manufacturing Company, Ltd., Hsinchu (TW)

(72) Inventors: Wen-I Hsu, Tainan (TW); Hsin-Hung Chen, Tainan (TW); Dun-Nian Yaung, Taipei (TW); Jen-Cheng Liu, Hsin-Chu (TW); Feng-Chi Hung, Chu-Bei (TW); Wen-Chang Kuo, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 441 days.

(21) Appl. No.: 18/150,247

(22) Filed: Jan. 5, 2023

(65) Prior Publication Data

US 2024/0030261 A1   Jan. 25, 2024

Related U.S. Application Data

(60) Provisional application No. 63/417,351, filed on Oct. 19, 2022, provisional application No. 63/391,902, filed on Jul. 25, 2022.

(51) Int. Cl.
*H10F 39/00* (2025.01)
*H10F 39/18* (2025.01)

(52) U.S. Cl.
CPC ......... *H10F 39/807* (2025.01); *H10F 39/014* (2025.01); *H10F 39/18* (2025.01); *H10F 39/811* (2025.01)

(58) Field of Classification Search
CPC ...... H10F 39/807; H10F 39/014; H10F 39/18; H10F 39/811
See application file for complete search history.

(56) References Cited

U.S. PATENT DOCUMENTS 10,014,338 B2 *   7/2018   Lee ..................... H10F 39/8063
12,262,562 B2 *   3/2025   Mun ...................... H10F 39/18
(Continued)

FOREIGN PATENT DOCUMENTS

WO       2021215290 A1    10/2021

*Primary Examiner* — Eugene Lee
(74) *Attorney, Agent, or Firm* — Eschweiler & Potashnik, LLC

(57) ABSTRACT

Various embodiments of the present disclosure are directed towards an image sensor including a plurality of photodetectors disposed within a substrate. The photodetectors are disposed respectively within a plurality of pixel regions. A floating diffusion node is disposed along a front-side surface of the substrate at a middle region of the plurality of pixel regions. A plurality of well regions is disposed within the substrate at corners of the plurality of pixel regions. An isolation structure extends into a back-side surface of the substrate. The isolation structure comprises a plurality of elongated isolation components disposed between adjacent pixel regions, a middle isolation component aligned with the floating diffusion node, and multiple peripheral isolation components aligned with the plurality of well regions. The elongated isolation components have a first height and the middle and peripheral isolation components have a second height less than the first height.

20 Claims, 23 Drawing Sheets

(56) References Cited

U.S. PATENT DOCUMENTS

| | | | |
|---|---|---|---|
| 12,310,137 B2* | 5/2025 | Chiang | H10F 39/807 |
| 2014/0054662 A1 | 2/2014 | Yanagita et al. | |
| 2015/0187826 A1 | 7/2015 | Suzuki | |
| 2016/0043119 A1* | 2/2016 | Lee | H10F 39/182 |
| | | | 257/446 |
| 2017/0110503 A1 | 4/2017 | Kato et al. | |
| 2018/0102389 A1 | 4/2018 | Lee | |
| 2018/0286896 A1 | 10/2018 | Kim et al. | |
| 2019/0115388 A1* | 4/2019 | Jung | H10F 39/813 |
| 2019/0371838 A1 | 12/2019 | Takahashi et al. | |
| 2020/0243578 A1* | 7/2020 | Pyo | H10F 39/8053 |
| 2021/0210532 A1 | 7/2021 | Hung et al. | |
| 2022/0130876 A1 | 4/2022 | Park et al. | |
| 2022/0223635 A1 | 7/2022 | Kao et al. | |
| 2022/0359583 A1* | 11/2022 | Huang | H10F 39/011 |
| 2022/0367558 A1 | 11/2022 | Fujii et al. | |
| 2022/0392930 A1* | 12/2022 | Chang | H10F 39/8063 |
| 2023/0215901 A1 | 7/2023 | Yamashita et al. | |
| 2023/0361149 A1* | 11/2023 | Chen | H10F 39/8053 |
| 2024/0266375 A1* | 8/2024 | Liu | H10F 39/807 |
| 2025/0089394 A1* | 3/2025 | Chung | H10F 39/182 |
| 2025/0267970 A1* | 8/2025 | Ogawa | H10F 39/182 |

\* cited by examiner

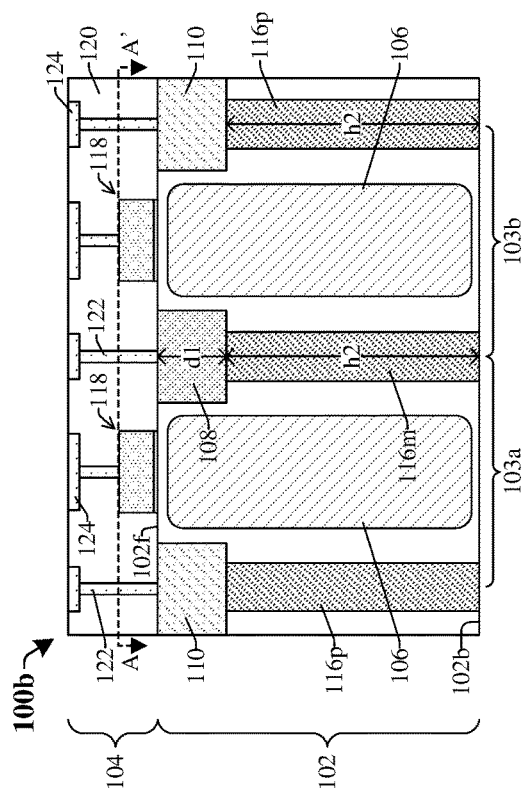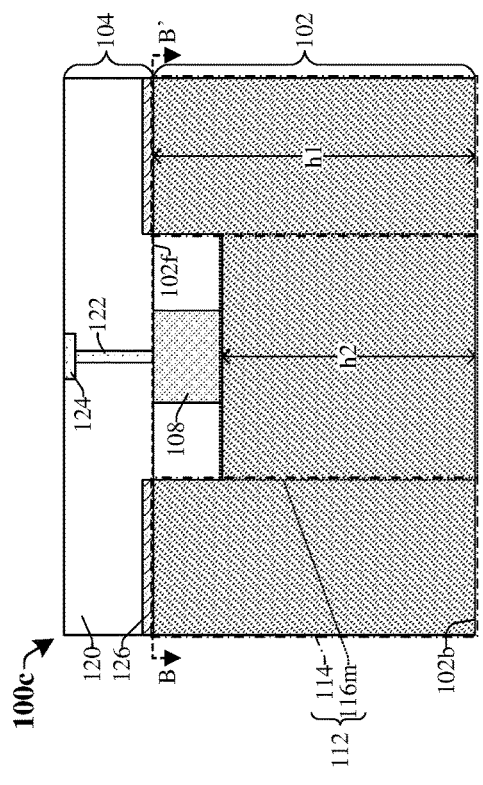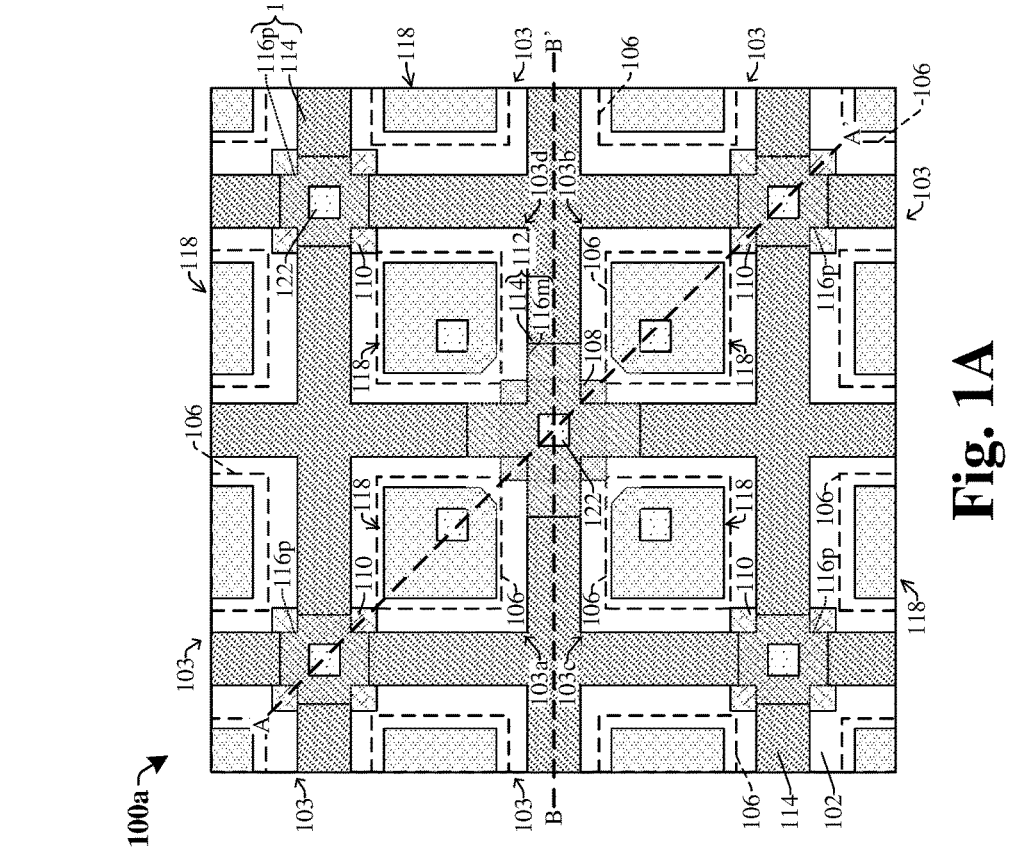

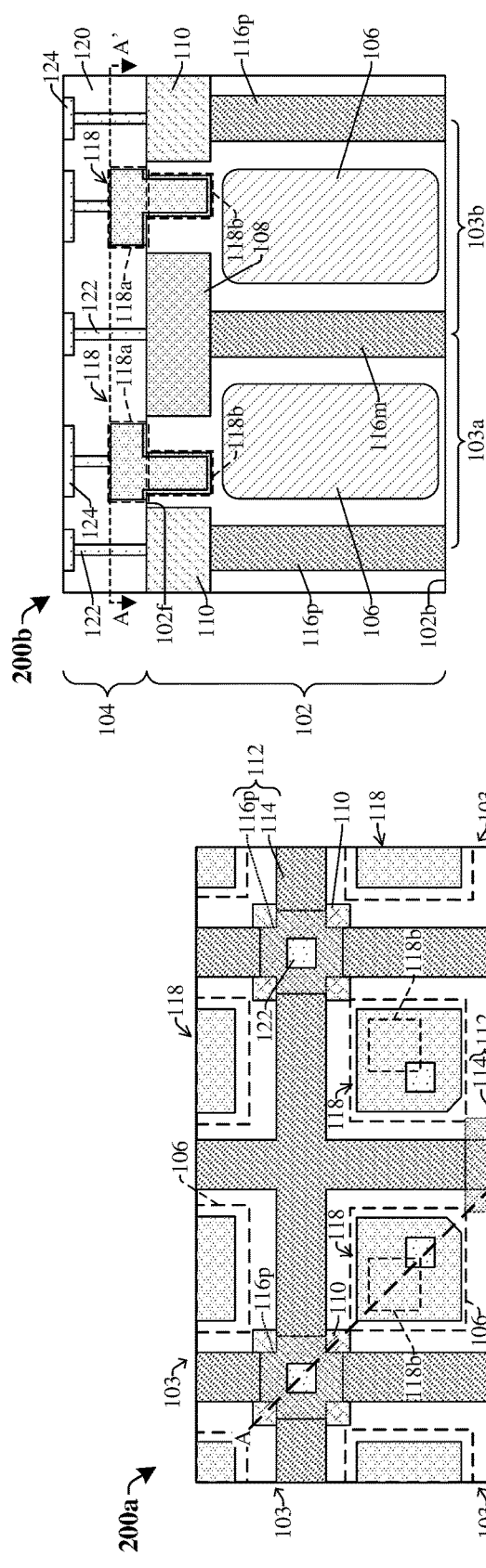
Fig. 2A
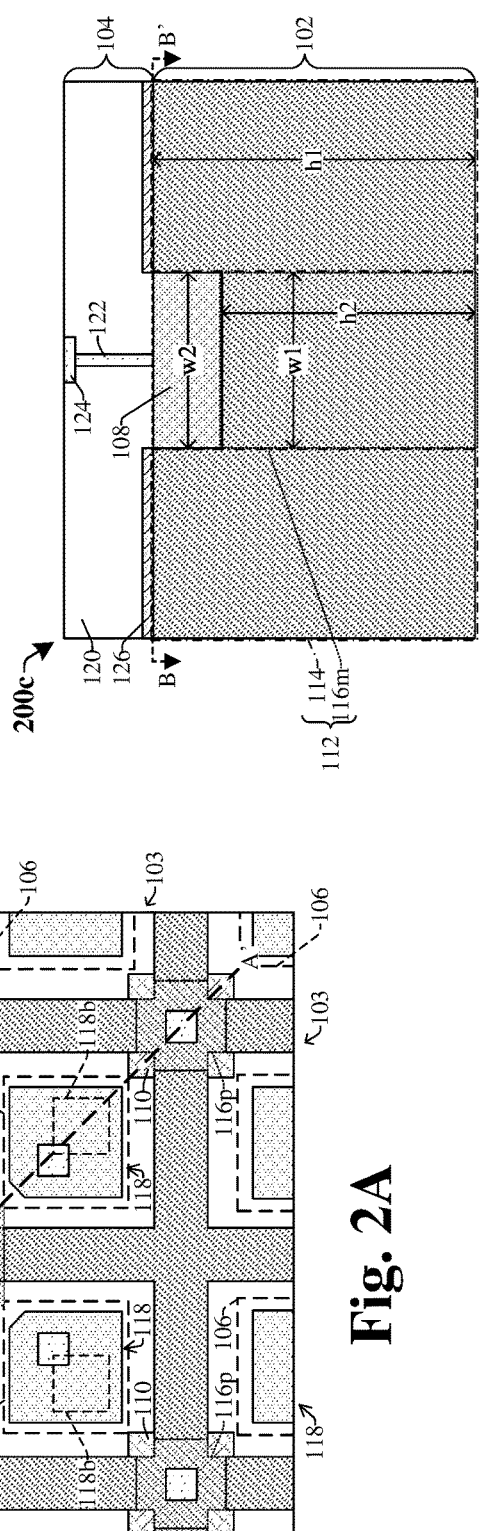
Fig. 2B
Fig. 2C

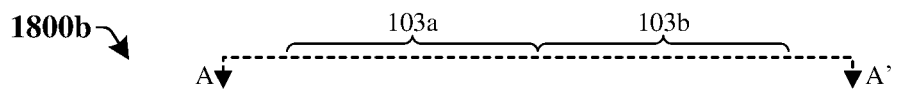
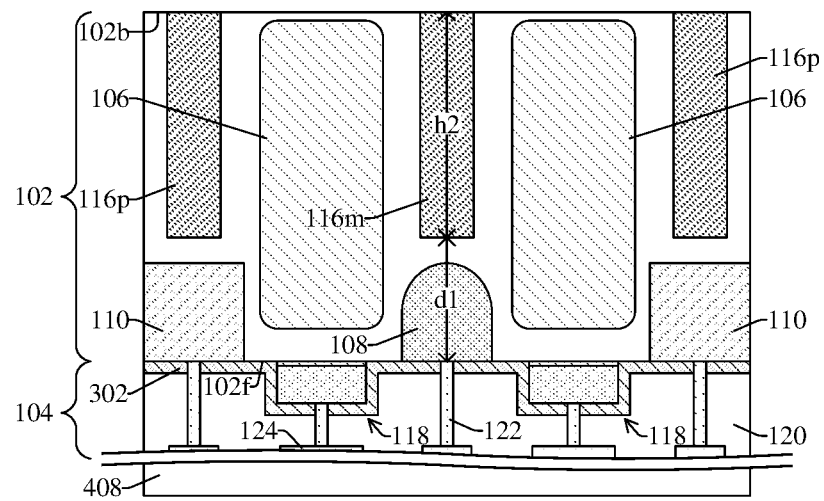
Fig. 18B
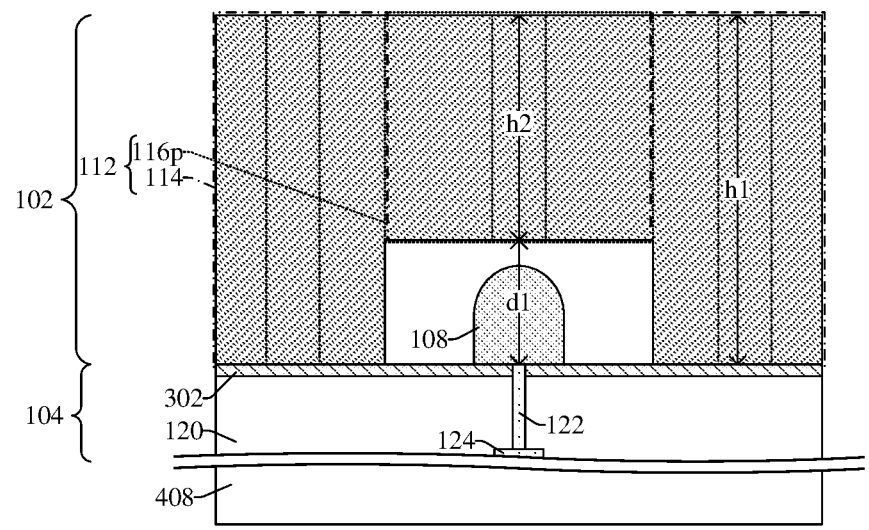
Fig. 18C

ISOLATION STRUCTURE WITH MULTIPLE COMPONENTS TO INCREASE IMAGE SENSOR PERFORMANCE

REFERENCE TO RELATED APPLICATIONS

This Application claims the benefit of U.S. Provisional Application No. 63/391,902, filed on Jul. 25, 2022 & U.S. Provisional Application No. 63/417,351, filed on Oct. 19, 2022. The contents of the above-referenced Patent Applications are hereby incorporated by reference in their entirety.

BACKGROUND

Many modern-day electronic devices (e.g., digital cameras, optical imaging devices, etc.) comprise image sensors. An image sensor comprises an array of pixel regions, and each pixel region contains a photodiode configured to capture optical signals (e.g., light) and convert it to digital data (e.g., a digital image). Complementary metal-oxide-semiconductor (CMOS) image sensors are often used over charge-coupled device (CCD) image sensors because of their many advantages, such as lower power consumption, faster data processing, and lower manufacturing costs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A-1C illustrate various views of some embodiments of an image sensor comprising a plurality of well regions and a plurality of pixel regions separated by an isolation structure having a plurality of isolation components with different heights.

FIGS. 2A-2C illustrate various views of some other embodiments of the image sensor of FIGS. 1A-1C.

DETAILED DESCRIPTION

Figure 3A:
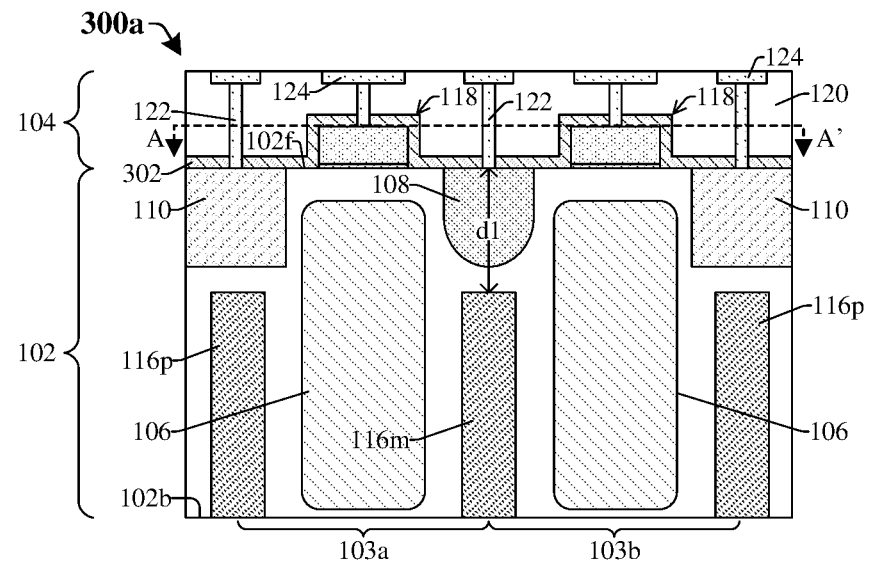
FIGS. 3A and 3B illustrate various cross-sectional views of further embodiments of the image sensor of FIGS. 1A-1C.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An image sensor includes a plurality of pixel regions arranged in an array. Each of the pixel regions comprise a photodetector (e.g., a photodiode) disposed within a substrate and configured to convert incident radiation (e.g., visible light) to charge carriers. A transfer gate structure is disposed on a front-side surface of the substrate and is configured to control a flow of the converted charge carriers to a floating diffusion node disposed along the front-side surface. The floating diffusion node is coupled to a plurality of pixel devices (e.g., a reset transistor, a source follower transistor, etc.) to facilitate digital readout of the converted incident radiation. Multiple pixel regions may share one floating diffusion node, where the floating diffusion node is arranged at a crossroad of neighboring pixel regions. For example, in a 2×2 shared pixel layout a floating diffusion node is disposed at a middle region of four adjacent photodetectors.

Utilizing one floating diffusion node for multiple pixel regions decreases a lateral footprint of the image sensor because adjacent pixel regions are arranged closer to one another. However, reducing the distance between the pixel regions may reduce electrical and optical isolation between adjacent photodetectors. An example of optical cross-talk is when incident radiation (e.g., light) enters a pixel region at an angle and crosses into an adjacent pixel region. An example of electrical cross-talk is when charge carriers in a photodetector migrate to an adjacent photodetector. In an effort to increase electrical and optical isolation, a deep trench isolation (DTI) structure is disposed within the substrate between adjacent pixel regions. The DTI structure may comprise a center isolation segment vertically extending towards the floating diffusion node and an outer isolation segment extending from the center isolation segment and separating adjacent pixel regions.

To prevent damage to the floating diffusion node, a height of the center isolation segment is less than a height of the outer isolation segment. This mitigates damage to the floating diffusion node during an etch process utilized to form an opening or trench for the DTI structure. Further, well regions are disposed in the substrate on opposing sides of the floating diffusion node. The well regions are disposed on just two sides of the floating diffusion node such that a layout of the image sensor is asymmetric or has a low order of rotational symmetry (i.e., rotational symmetry of order two). In addition, the well regions have a first doping type (e.g., p-type) opposite a second doping type (e.g., n-type) of the floating diffusion node. The well regions are coupled to a reference voltage (e.g., ground or 0 volts) and are configured to reduce noise across the image sensor. Features of the image sensor may be scaled down to increase a device density of the image sensor. Due to the asymmetric or low order of rotational symmetry layout of the image sensor, as device features are scaled down a minimum distance between the floating diffusion node and the well regions may be substantially short (e.g., smaller than a length or a width of a corresponding photodetector) such that junction leakage between the floating diffusion node and the well region occurs. As a result, electrical isolation is decreased and photo response non-uniformity (PRNU) and dark image non-uniformity (DINU) across the image sensor increases, thereby decreasing an overall performance of the image sensor.

In various embodiments, the present application is directed towards an image sensor having a plurality of well regions disposed around a floating diffusion node and an isolation structure comprising a plurality of elongated isolation components and a plurality of short isolation components. The image sensor may comprise a shared pixel layout structure (e.g., a 2×2 shared pixel layout) comprising the floating diffusion node arranged at a crossroad of a plurality of photodetectors. The short isolation components of the isolation structure comprise a middle isolation component arranged at the crossroad and multiple peripheral isolation components arranged at corners of the shared pixel layout structure. The elongated isolation components are disposed on each side of the shared pixel layout structure and laterally extend between the short isolation components. Further, the well regions are disposed at the corners of the shared pixel layout structure such that the peripheral isolation components vertically extend towards the well regions. The well regions comprise an opposite doping type relative to the floating diffusion node and are electrically coupled to a reference voltage (e.g., ground or 0 volts). By virtue of the peripheral isolation components and the well regions being disposed at the corners of the shared pixel layout structure, a layout of the image sensor has a high order of symmetry (e.g., has rotational symmetry of order four) and a minimum distance between the floating diffusion node and the well regions is increased. As a result, device features of the image sensor may be scaled while increasing electrical and optical isolation across the image sensor. This increases device density and decreases PRNU and DINU, thereby increasing an overall performance of the image sensor.

In addition, the elongated isolation components have a first height and the middle and peripheral isolation components have a second height less than the first height. By virtue of the middle and peripheral isolation components having the second height, damage to the floating diffusion node and the well regions is decreased. For example, during manufacturing of the image sensor, an etching process is performing on the substrate to form openings or a trench for the isolation structure. The etching process is performed such that openings for the elongated isolation components are deeper than openings for the middle and peripheral isolation components. This mitigates damage to the floating diffusion node and/or the well regions during the etching process, thereby increasing device yield and endurance.

FIGS. 1A-1C illustrate various views 100a-100c of some embodiments of an image sensor having a plurality of well regions 110 and a plurality of pixel regions 103 separated by an isolation structure 112 including a plurality of isolation components 114, 116m, 116p. FIG. 1A illustrates a top view 100a of the image sensor from a front-side surface 102f of a substrate 102. FIG. 1B illustrates a cross-sectional view 100b taken along line A-A' of the top view 100a of FIG. 1A. FIG. 1C illustrates a cross-sectional view 100c taken along line B-B' of the top view 100a of FIG. 1A. For clarity and ease of illustration, structure(s) (e.g., an interconnect dielectric structure 120) from the cross-sectional views 100b, 100c is/are omitted from the top view 100a of FIG. 1A and structures or regions (e.g., photodetectors 106, and isolation components 116m, 116p) of the image sensor of the cross-sectional views 100b, 100c are represented by dashed polygons and/or are at least partially transparent in the top view 100a of FIG. 1A.

As shown in the top view 100a of FIG. 1A, the image sensor comprises a shared pixel layout structure including a floating diffusion node 108 disposed at a crossroad of a plurality of pixel regions 103a-d. A plurality of photodetectors 106 is disposed within a substrate 102, where each pixel region 103a-d comprise an individual photodetector 106. The plurality of pixel regions 103a-d includes a first pixel region 103a, a second pixel region 103b, a third pixel region 103c, and a fourth pixel region 103d, where the first pixel region 103a is diagonally opposite the second pixel region 103b. The substrate 102 may comprise a semiconductor body (e.g., monocrystalline silicon, CMOS bulk, silicon-germanium, a silicon-on-insulator (SOI), etc.). In various embodiments, the substrate 102 has a first doping type (e.g., p-type). The photodetectors 106 and the floating diffusion node 108 may have a second doping type (e.g., n-type) opposite the first doping type. In some embodiments, the first doping type is p-type and the second doping type is n-type, or vice versa. The floating diffusion node 108 is disposed at a center and/or a crossroad of the shared pixel layout structure (e.g., disposed at a center and/or a crossroad of the plurality of pixel regions 103a-d).

Further, a plurality of well regions 110 is disposed within the substrate 102 and comprise the first doping type (e.g., p-type). The well regions 110 are disposed at corners of the shared pixel layout structure such that the well regions 110 are diagonally opposite a corner or edge of the floating diffusion node 108. The well regions 110 comprising the first doping type (e.g., p-type) opposite the second doping type (e.g., n-type) of the floating diffusion node 108 and the photodetectors 106.

A plurality of transfer gate structures 118 is disposed on the substrate 102 and the transfer gate structures 118 are aligned with a corresponding photodetector 106. The photodetectors 106 are configured to absorb incident light (e.g., photons) and generate respective electrical signals corresponding to the incident light. For example, the photodetectors 106 may generate electron-hole pairs from the incident light. In some embodiments, the transfer gate structures 118 are configured to control current flow between the floating diffusion node 108 and corresponding photodetectors 106. For example, the transfer gate structures 118 may be configured to selectively form a conductive channel in the substrate 102 between the floating diffusion node 108 and adjacent photodetectors 106 to transfer accumulated charge in the photodetectors 106 to the floating diffusion node 108.

An isolation structure 112 is disposed within the substrate 102 and is disposed between adjacent photodetectors 106. In some embodiments, the isolation structure 112 comprises a plurality of elongated isolation components 114 and a plurality of short isolation components 116m, 116p. In various embodiments, the plurality of short isolation components 116m, 116p comprises a middle isolation component 116m arranged at the crossroad and multiple peripheral isolation components 116p aligned with the plurality of well regions 110. In some embodiments, the elongated isolation components 114 may be referred to as first isolation components, the peripheral isolation components 116p may be referred to as second isolation components, and the middle isolation component 116m may be referred to as a center second isolation component or a middle second isolation component. In various embodiments, the elongated isolation components 114 have a first height (e.g., h1 of FIG. 1C) and the short isolation components 116m, 116p have a second height (e.g., h2 of FIGS. 1B and 1C) less than the first height (e.g., see FIG. 1C). The isolation structure 112 laterally surrounds each pixel region 103 and is configured to increase optical and electrical isolation across the image sensor.

By virtue of the well regions 110 being disposed at corners of the shared pixel layout structure, a layout of the shared pixel layout structure is highly symmetrical (e.g., having rotational symmetry of at least order four) and a minimum distance between the well regions 110 and the floating diffusion node 108 is increased. As a result, the well regions 110 may increase electrical isolation across the substrate 102 between neighboring pixel regions (e.g., between pixel regions in neighboring shared pixel layout structures) while mitigating junction leakage between the floating diffusion node 108 and the well regions 110. This facilitates shrinking device features of the image sensor while increasing electrical and optical isolation across the image sensor. In further embodiments, the shared pixel layout structure of FIG. 1A has at least rotational symmetry of order four with respect to the floating diffusion node 108 such that an interaction of incident radiation is uniform across the image sensor. As a result, PRNU and DINU across the image sensor is decreased such that an overall performance of the image sensor is increased.

In various embodiments, a length and width of the middle isolation component 116m is greater than a length and a width of the floating diffusion node 108. In further embodiments, the length and the width of the middle isolation component 116m is greater than a length and a width of each of the peripheral isolation components 116p.

As shown in the cross-sectional views 100b and 100c of FIGS. 1B-1C taken respectively along lines A-A' and B-B' in FIG. 1A, an interconnect structure 104 overlies the front-side surface 102f of the substrate 102. In some embodiments, the interconnect structure 104 comprises a plurality of conductive vias 122 and a plurality of conductive wires 124 disposed within the interconnect dielectric structure 120. In some embodiments, the plurality of conductive vias 122 comprise a plurality of conductive ground vias directly overlying and coupled to the well regions 110, where the conductive ground vias are configured to directly electrically couple the well regions 110 to ground (e.g., 0 volts). Further, the plurality of transfer gate structures 118 may comprise a transfer gate electrode and a transfer gate dielectric disposed between the substrate 102 and the transfer gate electrode. The transfer gate electrode may, for example, be or comprise aluminum, titanium, tantalum, polysilicon, another conductive material, or any combination of the foregoing. The transfer gate dielectric may, for example, be or comprise silicon dioxide, a high-k dielectric material such as aluminum oxide, hafnium oxide, another dielectric material, or any combination of the foregoing.

In various embodiments, the middle isolation component 116m and the peripheral isolation components 116p continuously extend from a back-side surface 102b of the substrate 102 towards the front-side surface 102f. The middle isolation component 116m is arranged under the floating diffusion node 108 and is separated from the front-side surface 102f by a first distance d1. In some embodiments, the first distance d1 is equal to a height of the floating diffusion node 108 such that a top surface of the middle isolation component 116m contacts a bottom of the floating diffusion node 108. In yet further embodiments, the peripheral isolation components 116p are arranged under a corresponding well region 110 and are separated from the front-side surface 102f by the first distance d1. The middle isolation component 116m is disposed between the first pixel region 103a and the second pixel region 103b. Further, an etch stop layer 126 is disposed on the front-side surface 102f of the substrate 102. In some embodiments, the etch stop layer 126 is disposed along top surfaces of the elongated isolation components 114.

In some embodiments, the plurality of elongated isolation components 114 have the first height h1 and the plurality of short isolation components 116m, 116p have the second height h2 that is less than the first height h1. By virtue of the first height h1 being greater than the second height h2, the elongated isolation components 114 increase optical and electrical isolation between adjacent pixel regions 103. In addition, the smaller second height h2 of the short isolation components 116m, 116p promotes electrical and optical isolation between the pixel regions 103 while mitigating damage to doped regions (e.g., the floating diffusion node 108, the well regions 110, etc.) of the image sensor. For example, during manufacturing of the image sensor an etching process may be performed into the back-side surface 102b of the substrate 102 to form openings for the isolation structure 112. The etching process is performed such that openings for the elongated isolation components 114 are deeper than openings for the short isolation components 116m, 116p. This mitigates damage to the floating diffusion node 108 and/or the well regions 110 during the etching process. Therefore, the image sensor comprising the elongated isolation components 114 and the plurality of short isolation components 116m, 116p with different heights increases optical and electrical isolation across the image sensor while increasing device stability and endurance.

FIGS. 2A-2C illustrate various 200a-200c of some embodiments of an image sensor having a plurality of well regions 110 and a plurality of pixel regions 103 separated by an isolation structure 112 including a plurality of isolation components 114, 116m, 116p. FIG. 2A illustrates a top view 200a of the image sensor from a front-side surface 102f of a substrate 102. FIG. 2B illustrates a cross-sectional view 200b taken along line A-A' of the top view 200a of FIG. 2A. FIG. 2C illustrates a cross-sectional view 200c taken along line B-B' of the top view 200a of FIG. 2A. For clarity and ease of illustration, structure(s) (e.g., an interconnect dielectric structure 120) from the cross-sectional views 200b, 200c is/are omitted from the top view 200a of FIG. 2A and structures or regions (e.g., photodetectors 106, and isolation components 116m, 116p) of the image sensor of the cross-sectional views 200b, 200c are represented by dashed polygons and/or are at least partially transparent in the top view 200a of FIG. 2A.

The image sensor comprises an interconnect structure 104 disposed on the front-side surface 102f of the substrate 102. A plurality of pixel regions 103 is disposed across the substrate 102. Each pixel region 103 comprises a photodetector 106 disposed within the substrate 102. The isolation structure 112 extends into a back-side surface 102b of the substrate 102 and laterally encloses each photodetector 106. The isolation structure 112 is configured to provide isolation between neighboring pixel regions 103. In some embodiments, the isolation structure 112 includes a plurality of elongated isolation components 114, a middle isolation component 116m, and a plurality of peripheral isolation components 116p. The substrate 102 may, for example, be or comprise silicon, monocrystalline silicon, epitaxial silicon, germanium, silicon germanium, a III-V material (e.g., gallium nitride, etc.), another semiconductor material, or the like. In some embodiments, the substrate 102 has a first doping type (e.g., p-type).

The interconnect structure 104 comprises the interconnect dielectric structure 120, a plurality of conductive vias 122, and a plurality of conductive wires 124. The interconnect dielectric structure 120 may comprise one or more dielectric layers that may, for example, each be or comprise silicon dioxide, a low-k dielectric material, silicon nitride, silicon carbide, another dielectric material, or any combination of the foregoing. As used herein, a low-k dielectric material is a dielectric material with a dielectric constant less than 3.9. The conductive vias and wires 122, 124 may, for example, be or comprise aluminum, copper, ruthenium, tungsten, another conductive material, or any combination of the foregoing.

The photodetectors 106 are disposed within the substrate 102 and comprise a second doping type (e.g., n-type) opposite the first doping type (e.g., p-type). In some embodiments, a doping concentration of the photodetectors 106 is within a range of about $5*10^{11}$ to $5*10^{14}$ atoms/cm$^3$ or another suitable value. In various embodiments, the image sensor comprises a shared pixel layout structure comprising a plurality of pixel regions 103a-d disposed around a floating diffusion node 108. The floating diffusion node 108 is disposed within the substrate 102 and comprises the second doping type (e.g., n-type). In some embodiments, a doping concentration of the floating diffusion node 108 is within a range of about $10^{13}$ to $10^{16}$ atoms/cm$^3$ or another suitable value. In further embodiments, the doping concentration of the photodetectors 106 is less than the doping concentration of the floating diffusion node 108. The middle isolation component 116m continuously extends from the back-side surface 102b of the substrate 102 towards the floating diffusion node 108.

A plurality of well regions 110 is disposed within the front-side surface 102f of the substrate 102. In some embodiments, the well regions 110 have the first doping type (e.g., p-type) and have a doping concentration within a range of about $10^{13}$ to $10^{16}$ atoms/cm$^3$ or another suitable value. In various embodiments, the doping concentration of the well regions 110 are equal to the doping concentration of the floating diffusion node 108. In further embodiments, the well regions 110 are disposed at corners or edges of the shared pixel layout structure and are each diagonally opposite a corresponding edge of the floating diffusion node 108. In some embodiments, the well regions 110 are directly electrically coupled to a reference voltage, such as ground (e.g., 0 volts), and is configured to bias the substrate 102 with the reference voltage. In yet further embodiments, the well regions 110 are referred to as ground well regions. By virtue of the well regions 110 being disposed at corners or edges of the shared pixel layout structure, a layout of the image sensor is highly symmetric (e.g., has rotational symmetry of at least order four with respect to a center region of the plurality of pixel regions 103a-d) such that PRNU and DINU across the image sensor is decreased. In addition, disposing the well regions 110 at the corners or edges of the shared pixel layout structure increases a minimum distance between the well regions 110 and the floating diffusion node 108, thereby decreasing junction leakage across the image sensor.

A plurality of transfer gate structures 118 are disposed on the substrate 102 and may be arranged with a corresponding photodetector 106. The transfer gate structures 118 are configured to control current flow between the floating diffusion node 108 and corresponding photodetectors 106. Further, the plurality of transfer gate structures 118 may comprise a transfer gate electrode and a transfer gate dielectric disposed between the substrate 102 and the transfer gate electrode. In some embodiments, as illustrated in the cross-sectional view 200b of FIG. 2B, the transfer gate structures 118 respectively comprise a gate body 118a disposed on the front-side surface 102f of the substrate 102 and a gate protrusion 118b extending into the front-side surface 102f. In such embodiments, the transfer gate structures 118 are configured as vertical gate structures that may increase an ability for the transfer gate structures 118 to control the current flow between the floating diffusion node 108 and the photodetectors 106.

In various embodiments, the middle isolation component 116m is disposed at a crossroad of the plurality of pixel regions 103a-d and the peripheral isolation components 116p are disposed at corners or edges of the shared pixel layout structure. The peripheral isolation components 116p continuously extend from the back-side surface 102b of the substrate 102 towards the well regions 110. The elongated isolation components 114 continuously laterally extend between adjacent peripheral isolation components 116p and directly contact both the middle isolation component 116m and the peripheral isolation components 116p. The elongated isolation components 114 have a first height h1 and the middle and peripheral isolation components 116m, 116p have a second height h2 less than the first height h1. By virtue of the first height h1 being greater than the second height h2, isolation between neighboring pixel regions 103 is increased without damaging doped regions (e.g., the floating diffusion node 108, the well regions 110, etc.) of the image sensor.

In some embodiments, the isolation structure 112 comprises a dielectric material (e.g., silicon dioxide, aluminum oxide, silicon carbide, silicon nitride, etc.), a conductive material (e.g., copper, aluminum, titanium nitride, tungsten, etc.), another material, or any combination of the foregoing. In yet further embodiments, the isolation structure 112 may comprise a liner layer and a trench fill structure (not shown), where the trench fill structure extends into the back-side surface 102b of the substrate 102 and the liner layer is disposed between the trench fill structure and surfaces of the substrate 102. In such embodiments, the liner layer may comprise a dielectric material (e.g., silicon dioxide, aluminum oxide, silicon nitride, etc.) and the trench fill structure may comprise a metal material (e.g., aluminum, copper, tungsten, etc.). In various embodiments, the isolation structure 112 comprising the metal material may further increase optional isolation across the image sensor by decreasing optical cross-talk between neighboring pixel regions.

As illustrated in the cross-sectional view 200b of FIG. 2B, gate protrusions 118b of adjacent transfer gate structures 118 are disposed between the floating diffusion node 108 and adjacent well regions 110. In various embodiments, the middle isolation component 116m directly contacts the floating diffusion node 108 and the peripheral isolation components 116p directly contact corresponding well regions 110. In further embodiments, as illustrated in the cross-sectional view 200c of FIG. 2C, a first width w1 of the middle isolation component 116m is equal to a second width w2 of the floating diffusion node 108. In some embodiments, elongated isolation components are disposed on and contact opposing sides of the floating diffusion node 108.

Figure 3B:
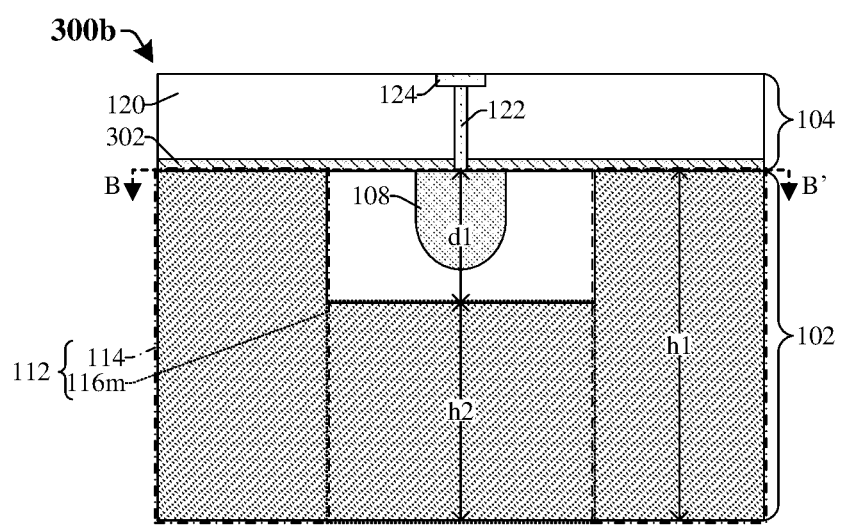

FIGS. 3A and 3B illustrate cross-sectional views 300a and 300b of some embodiments of an image sensor corresponding to some other embodiments of the image sensor of FIGS. 1A-1C, where the floating diffusion node 108 and the well regions 110 are vertically separated from the middle and peripheral isolation components 116m, 116p. In some embodiments, cross-sectional views 300a and 300b of FIGS. 3A and 3B are taken respectively along lines A-A' and B-B' of the top view 100a of FIG. 1A. In various embodiments, a contact etch stop layer (CESL) 302 continuously extends along the front-side surface 102f of the substrate 102. In some embodiments, the CESL 302 continuously extends from tops of the well regions 110 to sidewalls of the transfer gate structure 118.

Figure 4A:
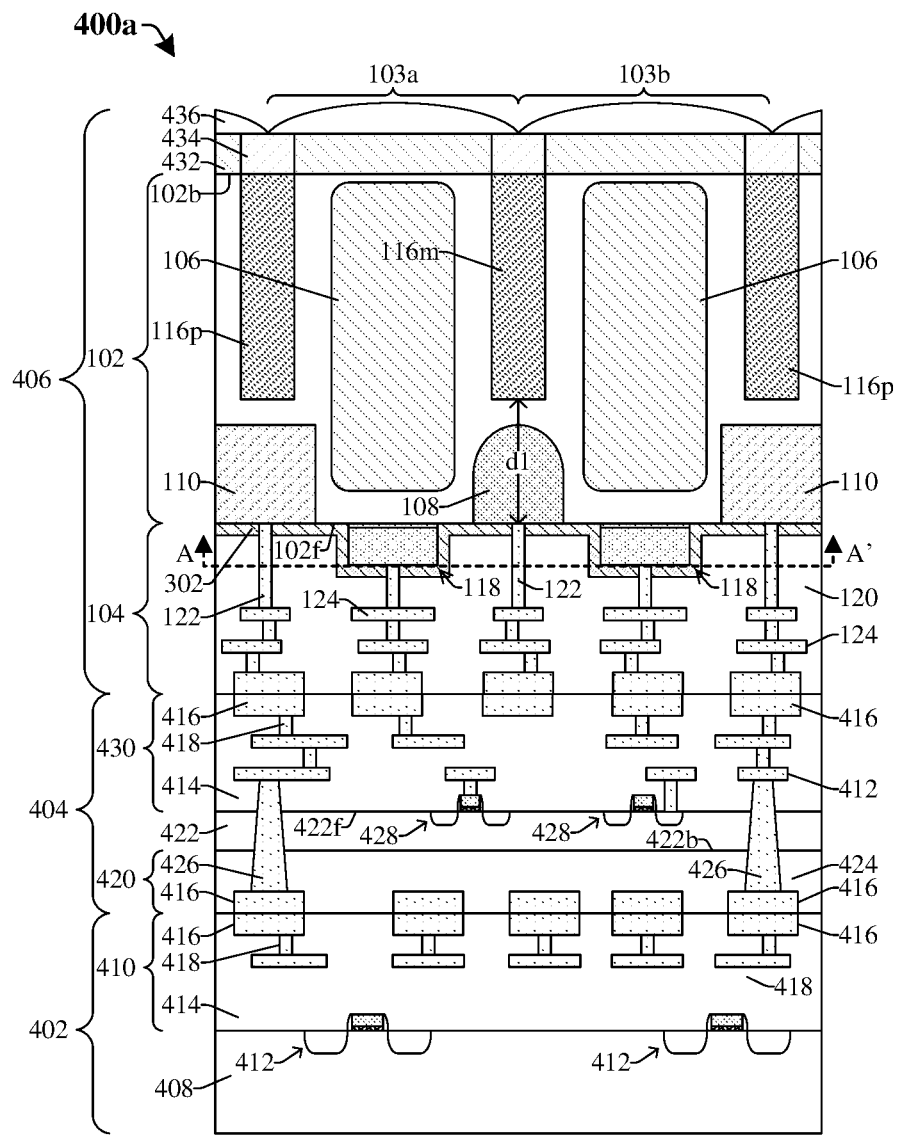
FIGS. 4A and 4B illustrate various cross-sectional views of some embodiments of an integrated chip (IC) comprising a first chip bonded to a second chip, and a pixel chip bonded to the second chip, where the pixel chip comprises a plurality of pixel regions separated by an isolation structure having a plurality of isolation components with different heights.
Figure 4B:
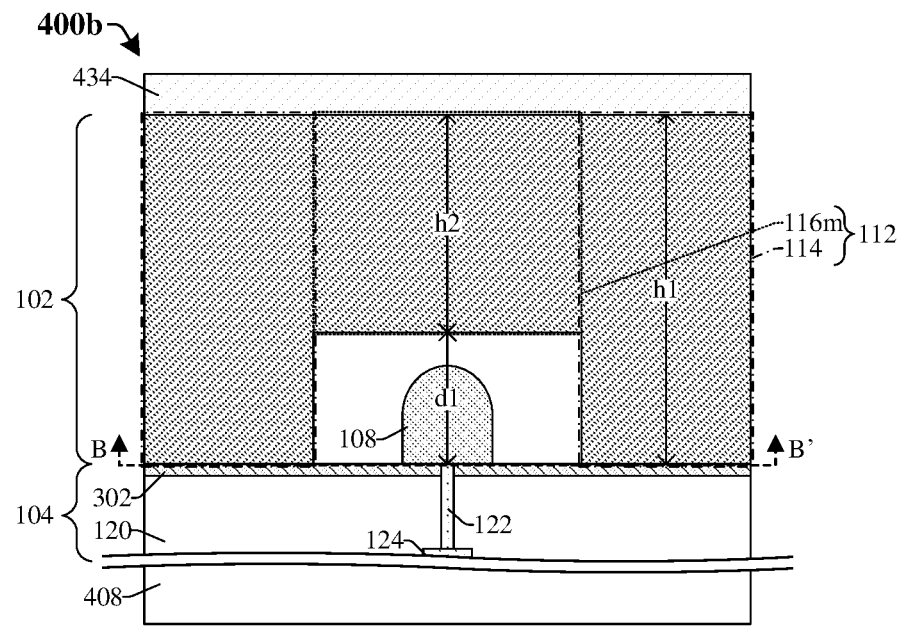

FIGS. 4A and 4B illustrate cross-sectional views 400a and 400b of some embodiments of an integrated chip (IC) comprising a pixel chip 406 having a plurality of well regions 110 and a plurality of pixel regions 103 separated by an isolation structure 112 including a plurality of isolation components 114, 116m, 116p. In some embodiments, cross-sectional views 400a and 400b of FIGS. 4A and 4B are taken respectively along lines A-A' and B-B' of the top view 100a of FIG. 1A.

As illustrated in FIG. 4A, the IC comprises a first chip 402, a second chip 404, and the pixel chip 406. The pixel chip 406 comprises the image sensor of the present disclosure (e.g., the image sensor of FIGS. 1A-1C, the image sensor of FIGS. 2A-2C, or the image sensor of FIGS. 3A-3B). For example, the pixel chip 406 comprises the plurality of pixel regions 103, the plurality of photodetectors 106, the isolation structure 112, the floating diffusion node 108, the well regions 110, and so on. It will be appreciated that for ease of illustration portions of the first chip 402, the second chip 404, and the interconnect structure 104 are omitted from the cross-sectional view 400b of FIG. 4B.

The first chip 402 comprises a first substrate 408, a first interconnect structure 410, and a first plurality of semiconductor devices 412 (e.g., metal-oxide-semiconductor field-effect transistors (MOSFETs)). In various embodiments, the first interconnect structure 410 comprises a dielectric structure 414, a plurality of conductive wires 416, and a plurality of conductive vias 418. The first interconnect structure 410 is configured to electrically couple the first plurality of semiconductor devices 412 to other semiconductor devices and/or structures (e.g., devices and/or structures of the second chip 404 and/or the pixel chip 406). In some embodiments, the first chip 402 may be configured as an application-specific integrated circuit (ASIC).

The second chip 404 comprises a back-side bond structure 420, a second substrate 422, a second interconnect structure 430, and a second plurality of semiconductor devices 428 (e.g., MOSFETs). The second interconnect structure 430 may comprise the dielectric structure 414, a plurality of conductive wires 416, and a plurality of conductive vias 418. The second interconnect structure 430 is configured to electrically couple the second plurality of semiconductor devices 428 to other semiconductor devices and/or structures (e.g., devices and/or structures of the first chip 402 and/or the pixel chip 406). The back-side bond structure 420 is disposed on a back-side surface 422b of the second substrate 422 and the second interconnect structure 430 is disposed on a front-side surface 422f of the second substrate 422. In some embodiments, the back-side bond structure 420 comprises a bond dielectric structure 424 and conductive wires 416. In various embodiments, a plurality of through-substrate vias (TSVs) 426 continuously extend from the back-side bond structure 420, through the second substrate 422, to the second interconnect structure 430. The plurality of TSVs 426 electrically couple the back-side bond structure 420 to the second interconnect structure 430. In various embodiments, the second plurality of semiconductor devices 428 may, for example, comprise one or more reset transistors, one or more source follower transistors, some other suitable pixel devices, or any combination of the foregoing. In such embodiments, the second plurality of semiconductor devices 428 may be configured to conduct digital readout of the plurality of photodetectors 106.

In various embodiments, a plurality of light filters 432 is disposed on the back-side surface 102b of the substrate 102. The light filters 432 directly overlie the photodetectors 106. A grid structure 434 directly overlies the isolation structure 112 and is configured to reduce optical cross-talk between the photodetectors 106. Further, a plurality of micro-lenses 436 is disposed over the light filters 432. The micro-lenses 436 are configured to direct incident electromagnetic radiation towards the photodetectors 106.

FIGS. 5-19B illustrate various views 500-1900b of some embodiments of a method of forming an image sensor comprising an isolation structure having a plurality of isolation components and a plurality of well regions with a symmetrical layout. Although the various views 500-1900b shown in FIGS. 5-19B are described with reference to the method, it will be appreciated that the structures shown in FIGS. 5-19B are not limited to the method but rather may stand alone separate of the method. Furthermore, although FIGS. 5-19B are described as a series of acts, it will be appreciated that these acts are not limited in that the order of the acts can be altered in other embodiments, and the methods disclosed are also applicable to other structures. In other embodiments, some acts that are illustrated and/or described may be omitted in whole or in part.

Figure 5:
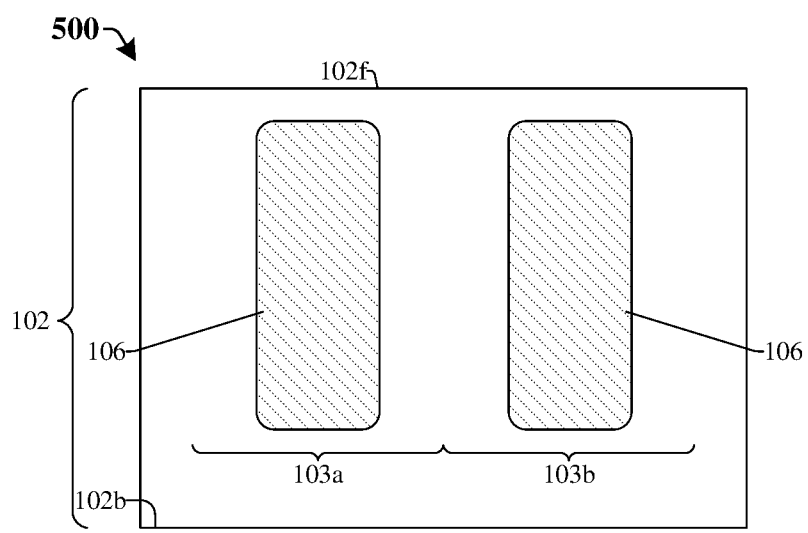
FIGS. 5-19B illustrate various views of some embodiments of a method of forming an image sensor comprising an isolation structure having a plurality of isolation components and a plurality of well regions with a symmetrical layout.

As shown in cross-sectional view 500 of FIG. 5, a plurality of photodetectors 106 is formed within a substrate 102. The substrate 102 may, for example, be or comprise silicon, monocrystalline silicon, epitaxial silicon, germanium, silicon germanium, a III-V material (e.g., gallium nitride, etc.), another semiconductor material, or the like and may have a first doping type (e.g., p-type). In some embodiments, a process for forming the photodetectors 106 includes: selectively forming a masking layer (not shown) over a front-side surface 102f of the substrate 102; performing a selective ion implantation process on the substrate 102 with the masking layer in place, thereby implanting one or more dopants within the substrate 102; and performing a removal process to remove the masking layer. Each photodetector 106 may be disposed within a corresponding pixel region 103, for example, a first pixel region 103a and a second pixel region 103b each comprise a photodetector 106. In various embodiments, the photodetectors 106 comprise a second doping type (e.g., n-type) opposite the first doping type (e.g., p-type). In some embodiments, a doping concentration of the photodetectors 106 is greater than a doping concentration of adjacent and/or surrounding regions of the substrate 102.

Figure 6:
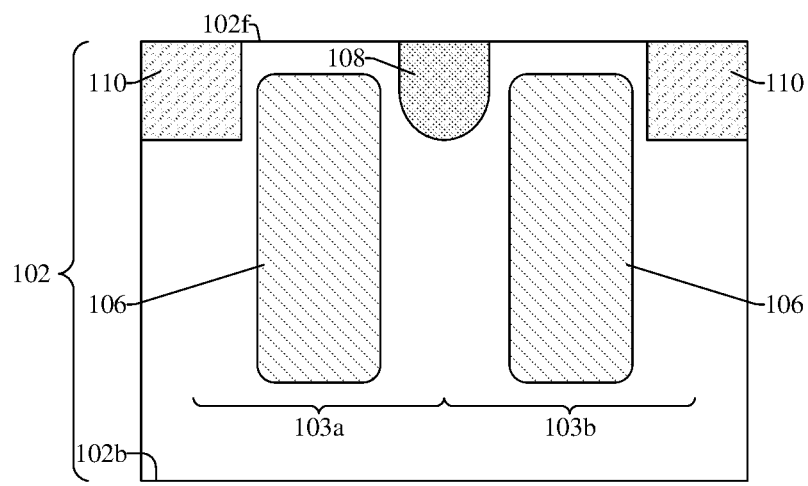

A shown in cross-sectional view 600 of FIG. 6, a floating diffusion node 108 and a plurality of well regions 110 are formed within the substrate 102. In some embodiments, the floating diffusion node 108 comprises the second doping type (e.g., n-type) and the well regions 110 comprise the first doping type (p-type). In various embodiments, a doping concentration of the floating diffusion node 108 and a doping concentration of the well regions 110 are both greater than the doping concentration of the photodetectors 106. In further embodiments, the well regions 110 may be referred to as ground well regions. In further embodiments, the floating diffusion node 108 and the plurality of well regions 110 may each be formed by an individual doping process that comprises: forming a masking layer (not shown) over the substrate 102; performing an ion implantation process with the masking layer in place, thereby implanting one or more dopants within the substrate 102; and performing a removal process to remove the masking layer. Further, the floating diffusion node 108, the well regions 110, and the photodetectors 106 may be formed such that the aforementioned doped regions have a same layout as illustrated and/or described in the top view 100a of FIG. 1A or the top view 200a of FIG. 2A.

Figure 7:
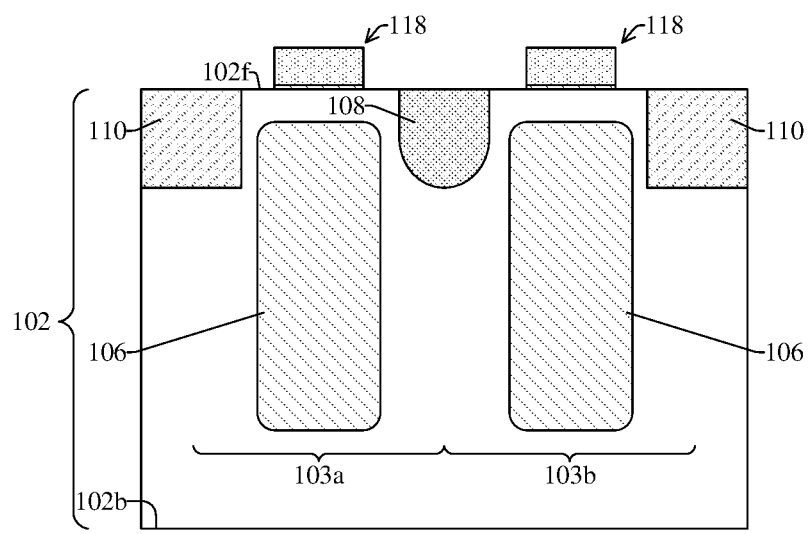

As shown in cross-sectional view 700 of FIG. 7, a plurality of transfer gate structures 118 is formed on the front-side surface 102f of the substrate 102. In some embodiments, the transfer gate structures 118 each comprise a transfer gate electrode over the substrate 102 and a transfer gate dielectric disposed between the transfer gate electrode and the substrate 102. In various embodiments, a process for forming the transfer gate structures 118 includes: depositing (e.g., by physical vapor deposition (PVD), chemical vapor deposition (CVD), atomic layer deposition (ALD), etc.) the transfer gate dielectric over the substrate 102; depositing (e.g., by PVD, CVD, sputtering, electroplating, etc.) the transfer gate electrode on the transfer gate dielectric; and performing a patterning process on the transfer gate electrode and the transfer gate dielectric. In various embodiments, the transfer gate structures 118 may be formed such that each transfer gate structure comprises a gate body overlying a gate protrusion that continuously extends from the gate body into the front-side surface 102f of the substrate 102, as illustrated and/or described in FIGS. 2A-2C.

Figure 8:
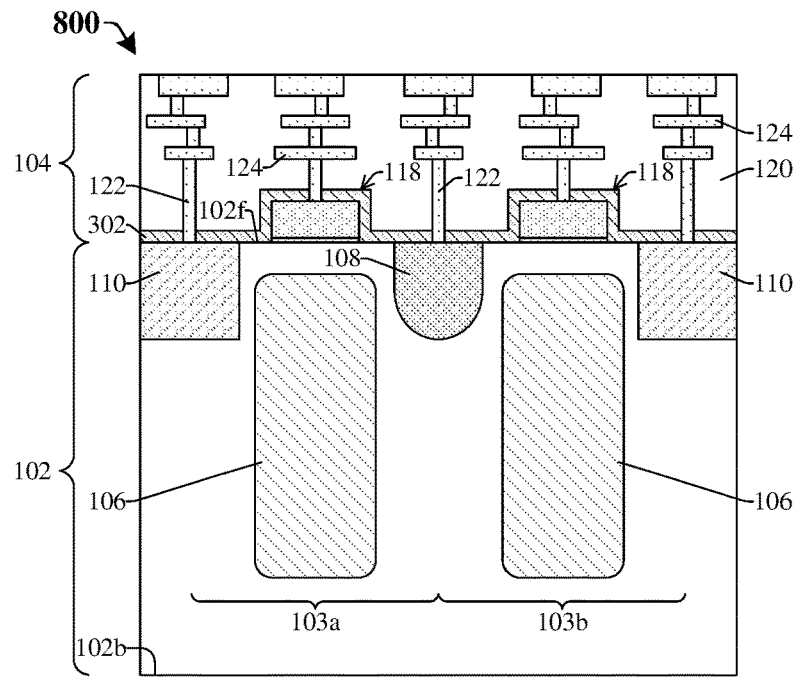

As shown in cross-sectional view 800 of FIG. 8, an interconnect structure 104 is formed on the front-side surface 102f of the substrate 102. The interconnect structure 104 comprises a contact etch stop layer (CESL) 302, an interconnect dielectric structure 120, a plurality of conductive vias 122, and a plurality of conductive wires 124. In various embodiments, the CESL 302 and the interconnect dielectric structure 120 may be formed by one or more deposition processes such as a PVD process, a CVD process, an ALD process, another suitable growth or deposition process, or any combination of the foregoing. In further embodiments, the plurality of conductive vias 122 and the plurality of conductive wires 124 may be formed by one or more deposition process(es), one or more patterning process(es), one or more planarization process(es), some other suitable fabrication process(es), or any combination of the foregoing.

Figure 9:
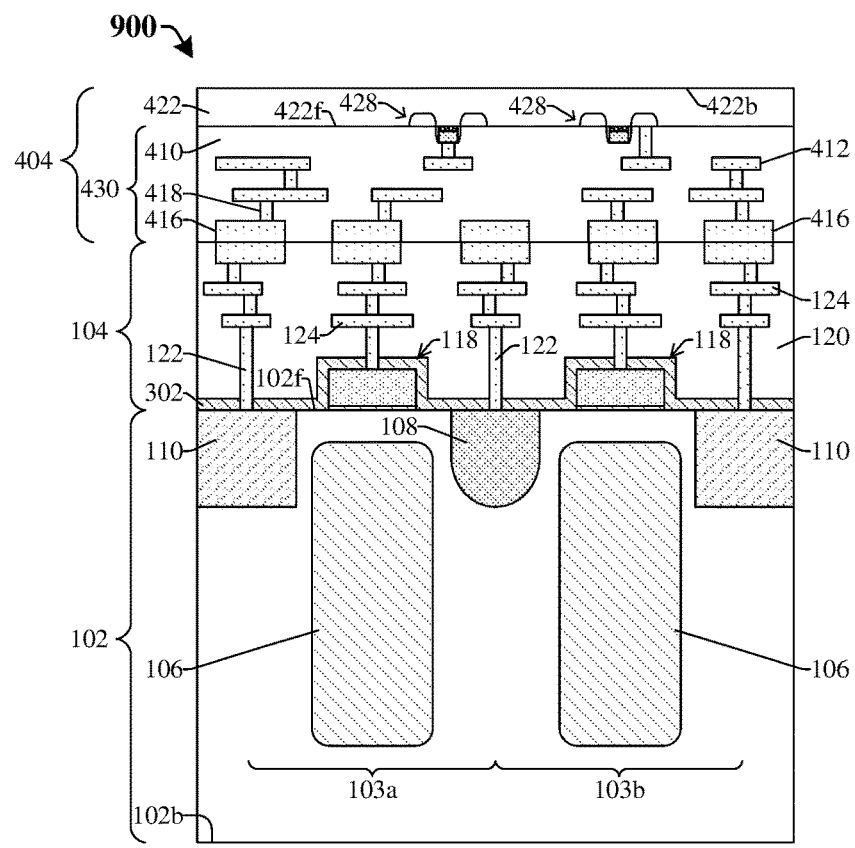

As shown in cross-sectional view 900 of FIG. 9, a second chip 404 is provided and is bonded to the interconnect structure 104. In various embodiments, the second chip 404 includes a second interconnect structure 430 disposed along a front-side surface 422f of a second substrate 422 and a second plurality of semiconductor devices 428 disposed within and/or on the second substrate 422. In various embodiments, the second chip 404 is bonded to the interconnect structure 104 by a eutectic bonding process, a fusion bonding process, a hybrid bonding process, or some other suitable bonding process.

Figure 10:
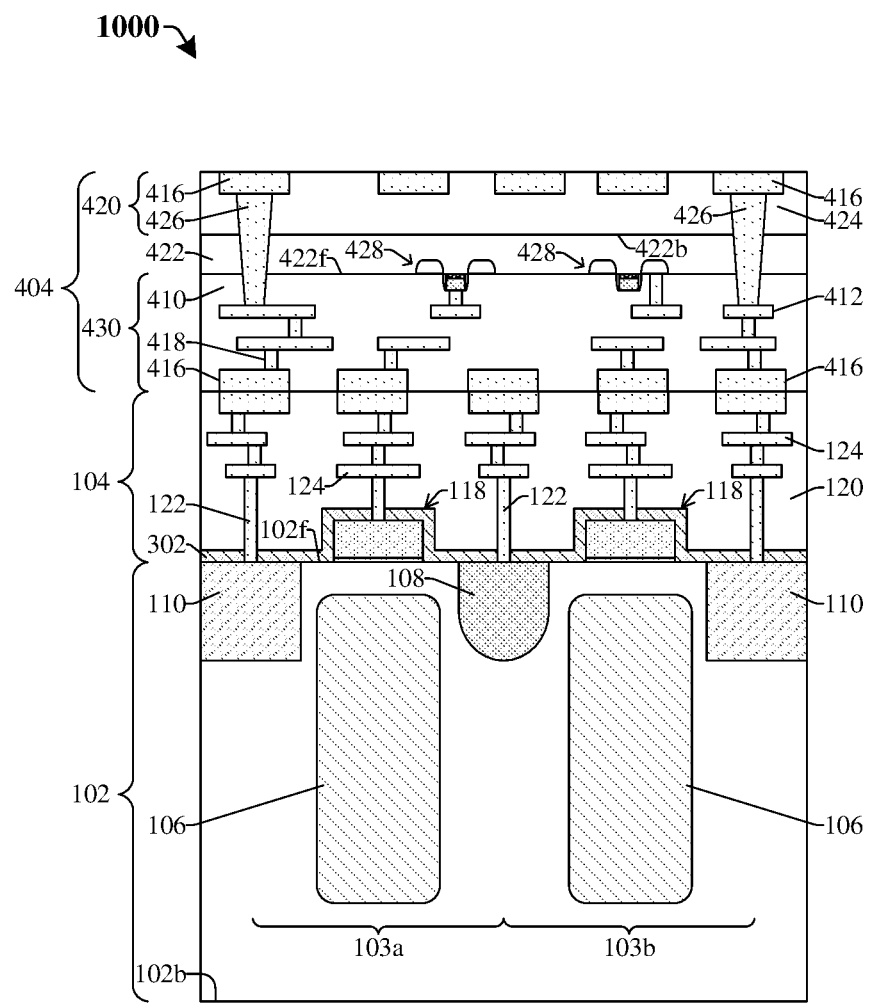

As shown in cross-sectional view 1000 of FIG. 10, a back-side bond structure 420 and a plurality of TSVs 426 are formed over and/or within the second substrate 422. In some embodiments, the back-side bond structure 420 and the plurality of TSVs may be formed by one or more deposition process(es), one or more patterning process(es), one or more planarization process(es), one or more ion implantation process(es), some other suitable fabrication process(es), or any combination of the foregoing.

Figure 11:
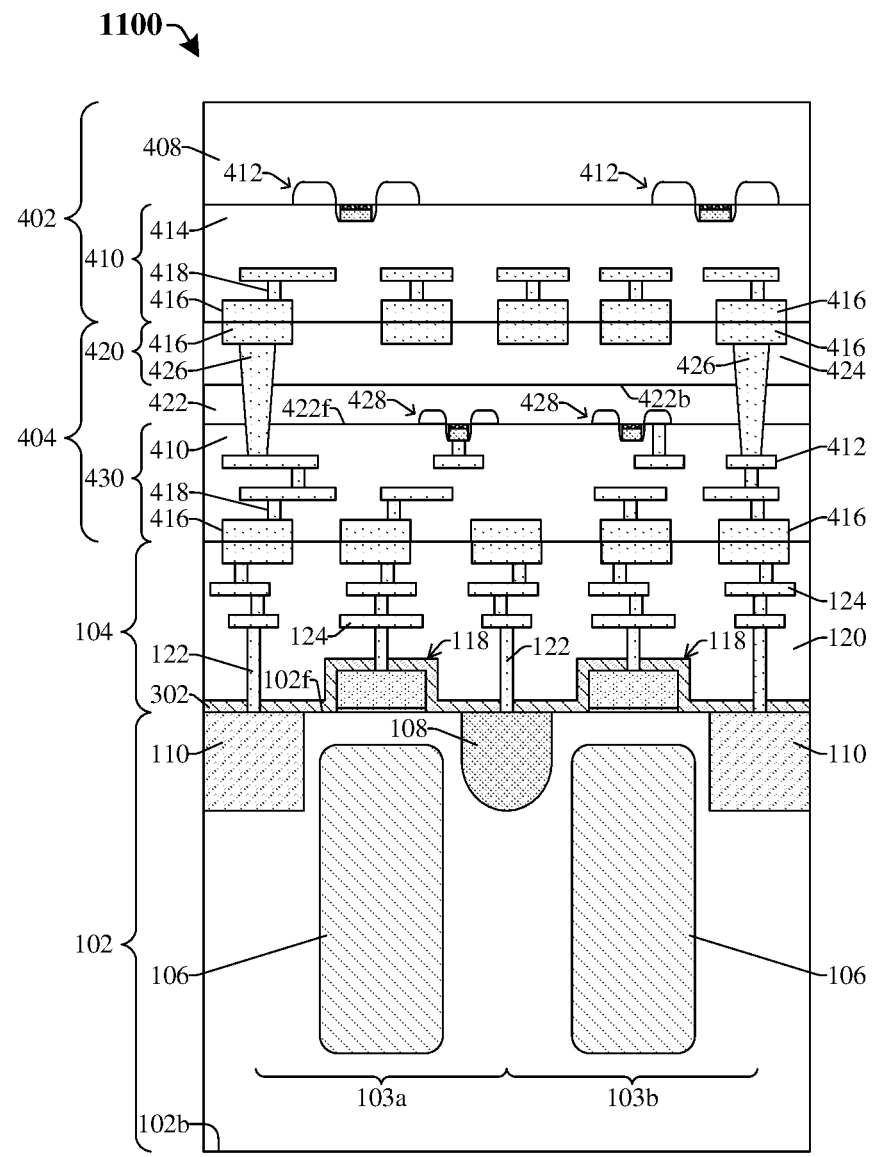

As shown in cross-sectional view 1100 of FIG. 11, a first chip 402 is provided and bonded to the second chip 404. In some embodiments, the first chip 402 includes a first substrate 408, a first interconnect structure 410, and a first plurality of semiconductor devices 412 disposed within and/or on the first substrate 408. In various embodiments, the first chip 402 is bonded to the second chip 404 by a eutectic bonding process, a fusion bonding process, a hybrid bonding process, or some other suitable bonding process.

Figure 12:
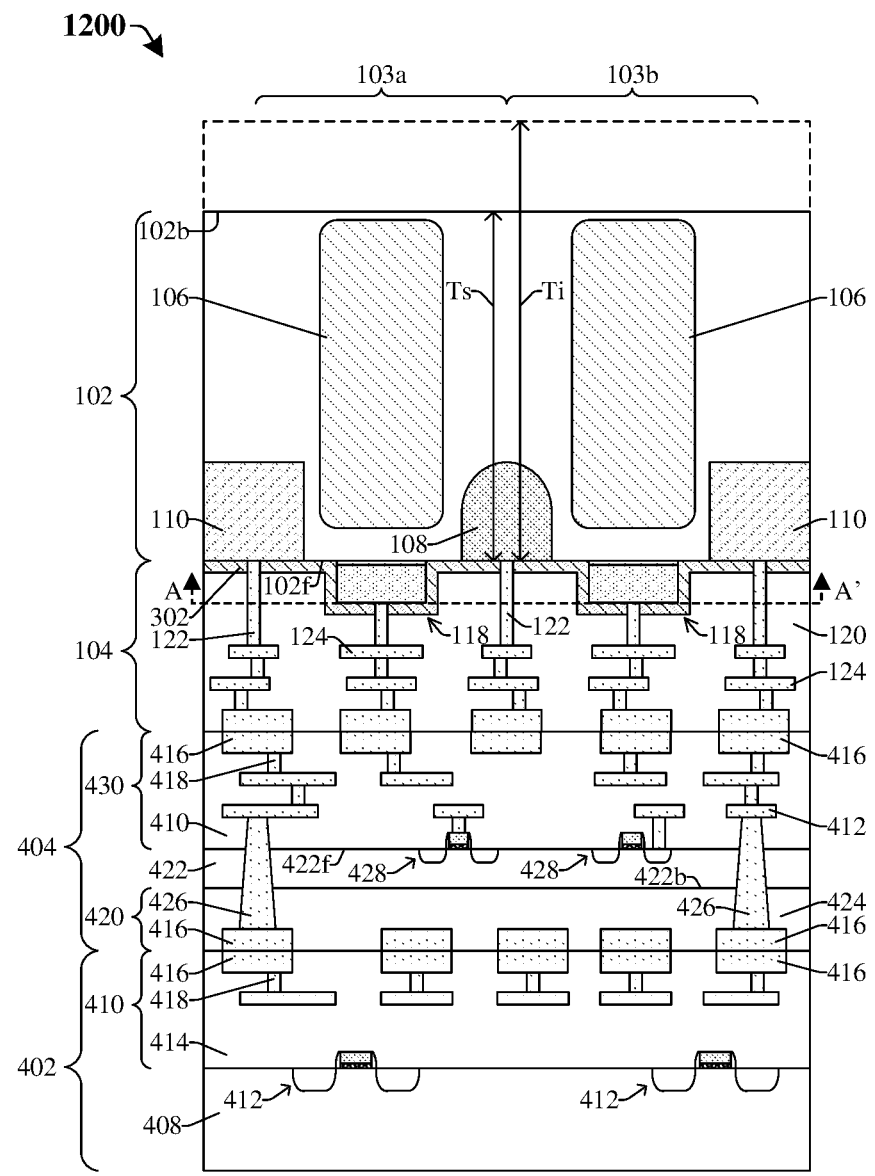

A shown in cross-sectional view 1200 of FIG. 12, a thinning process is performed on the substrate 102 to reduce an initial thickness Ti of the substrate 102 to a thickness Ts. In various embodiments, the thinning process includes performing a mechanical grinding process, a chemical mechanical planarization (CMP) process, an etch process, some other thinning process, or any combination of the foregoing.

Figure 13A:
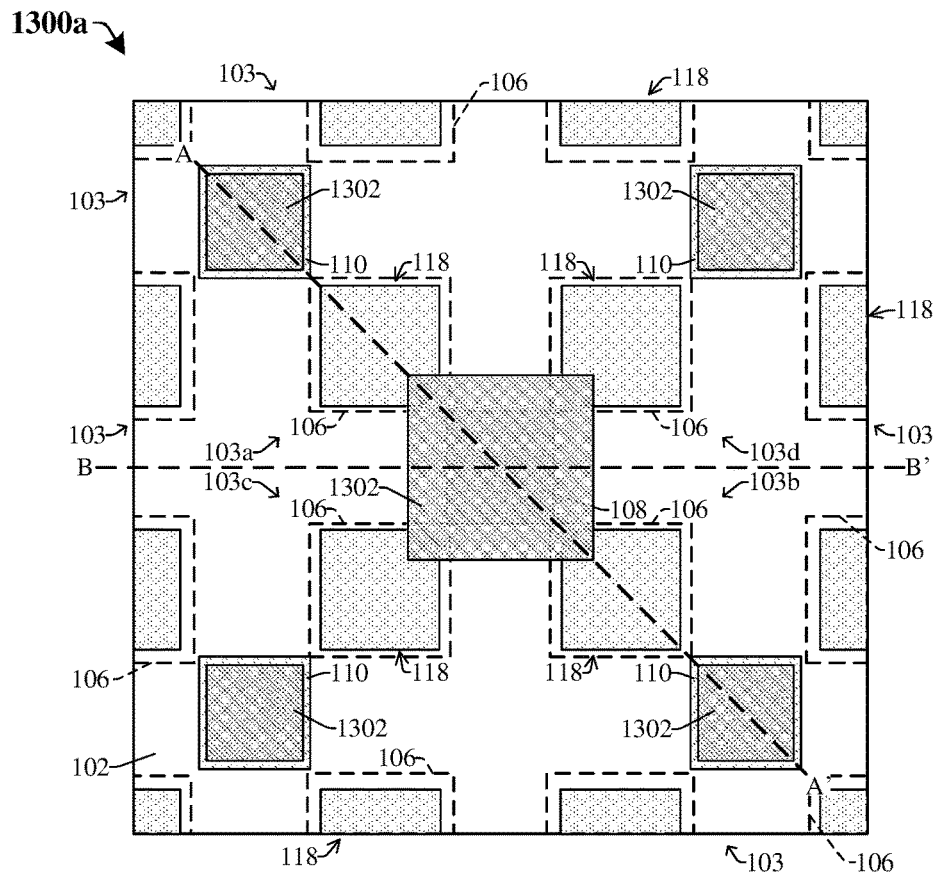
Figure 13B:
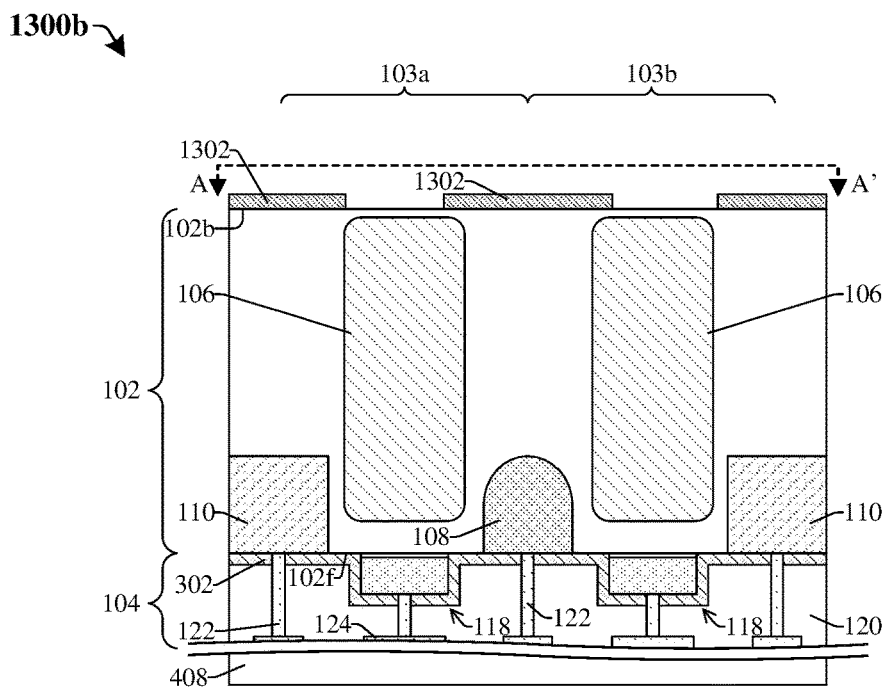
Figure 13C:
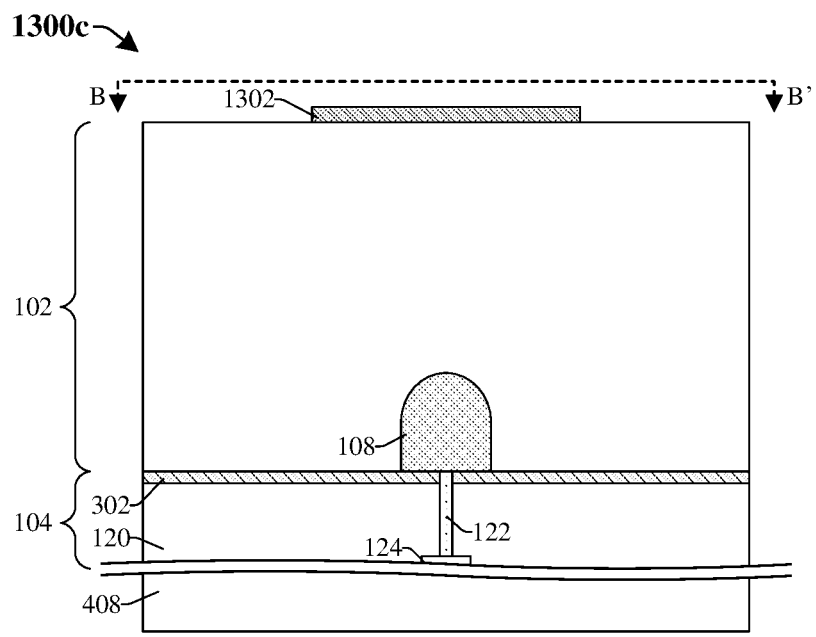

As shown in top view 1300a of FIG. 13A and cross-sectional views 1300b-1300c of FIGS. 13B-13C taken respectively along lines A-A' and B-B' in the top view 1300a, in some embodiments, a hard mask structure 1302 is formed over the back-side surface 102b of the substrate 102. It will be appreciated that for ease of illustration portions of the first chip (402 of FIG. 12), the second chip (404 of FIG. 12), and the interconnect structure (104 of FIG. 12) are omitted from FIGS. 13A-13B and other subsequent figures in the method of FIGS. 5-19B. In various embodiments, the hard mask structure 1302 comprises multiple components, where a first hard mask component is aligned over the floating diffusion node 108 and multiple peripheral hard mask components aligned with a corresponding well region 110. In some embodiments, the first hard mask component is larger than each individual peripheral hard mask component.

Figure 14A:
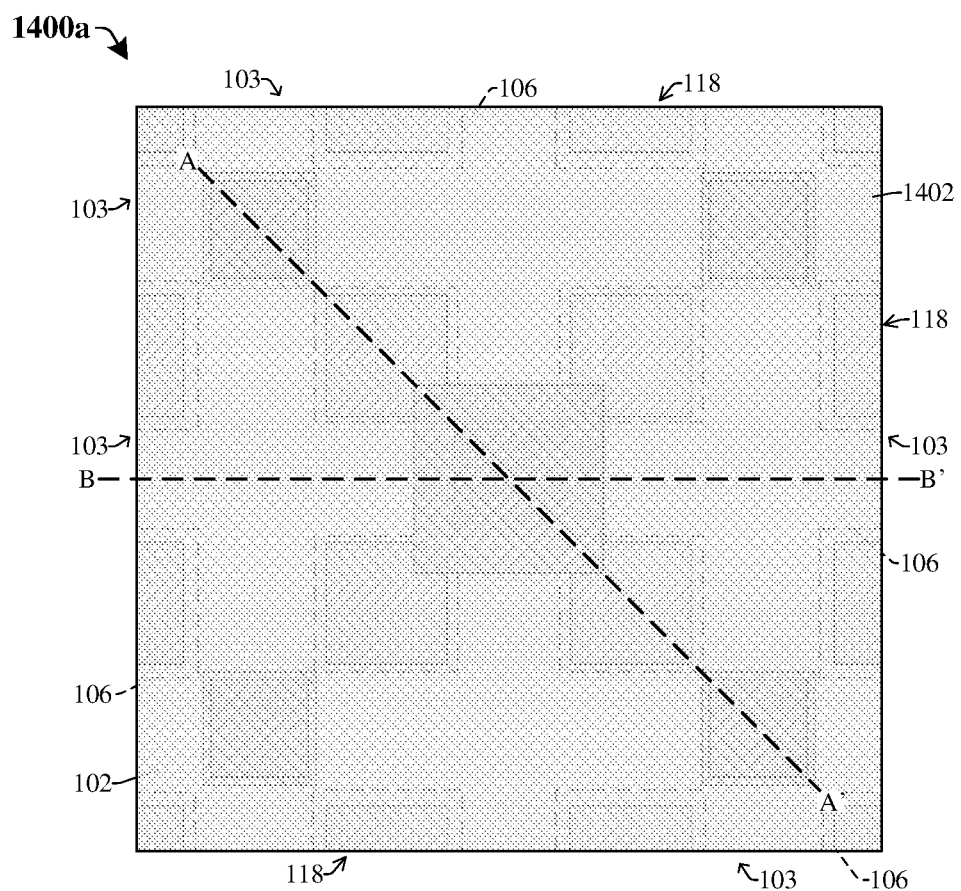
Figure 14B:
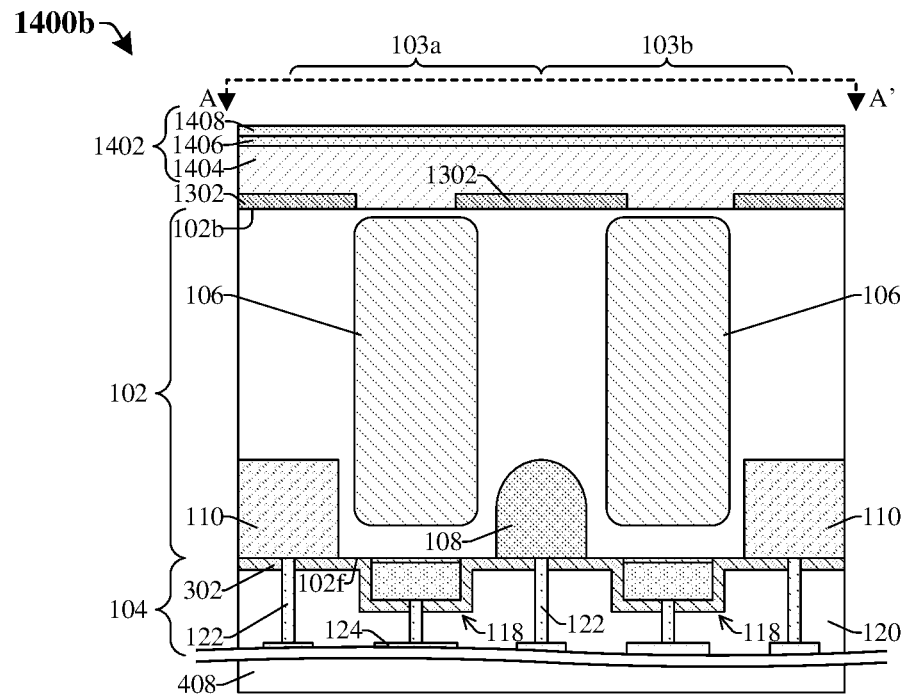
Figure 14C:
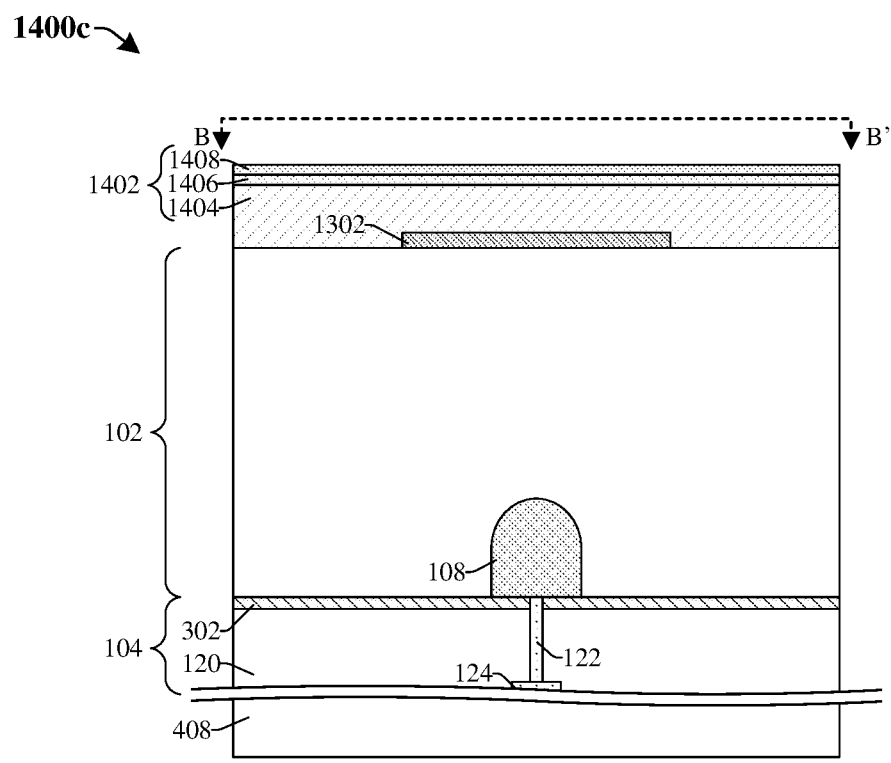

As shown in top view 1400a of FIG. 14A and cross-sectional views 1400b-1400c of FIGS. 14B-14C taken respectively along lines A-A' and B-B' in the top view 1400a, in some embodiments, an upper dielectric structure 1402 is formed over the hard mask structure 1302. In some embodiments, the upper dielectric structure 1402 comprises a first dielectric layer 1404, a second dielectric layer 1406, and a third dielectric layer 1408.

Figure 15A:
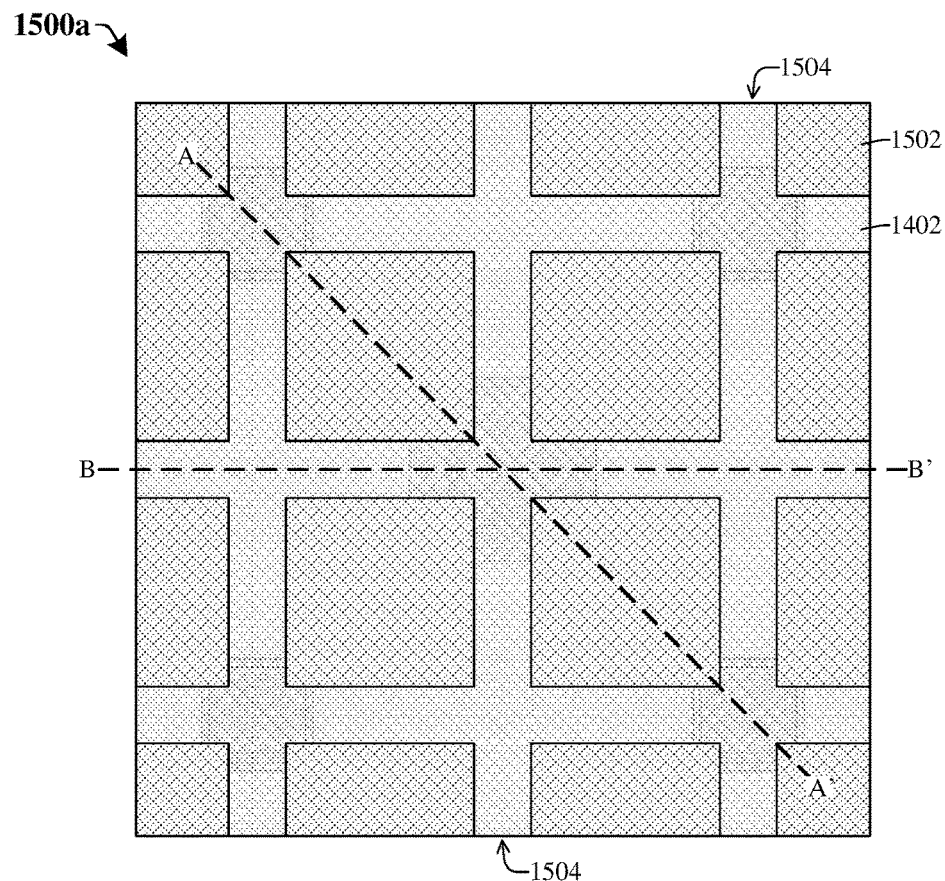
Figure 15B:
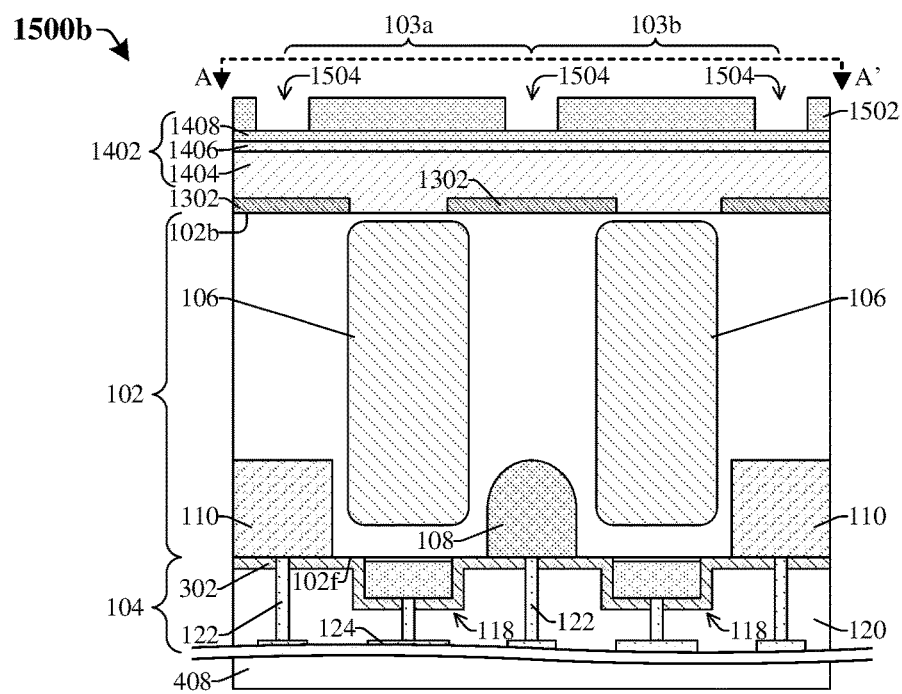
Figure 15C:
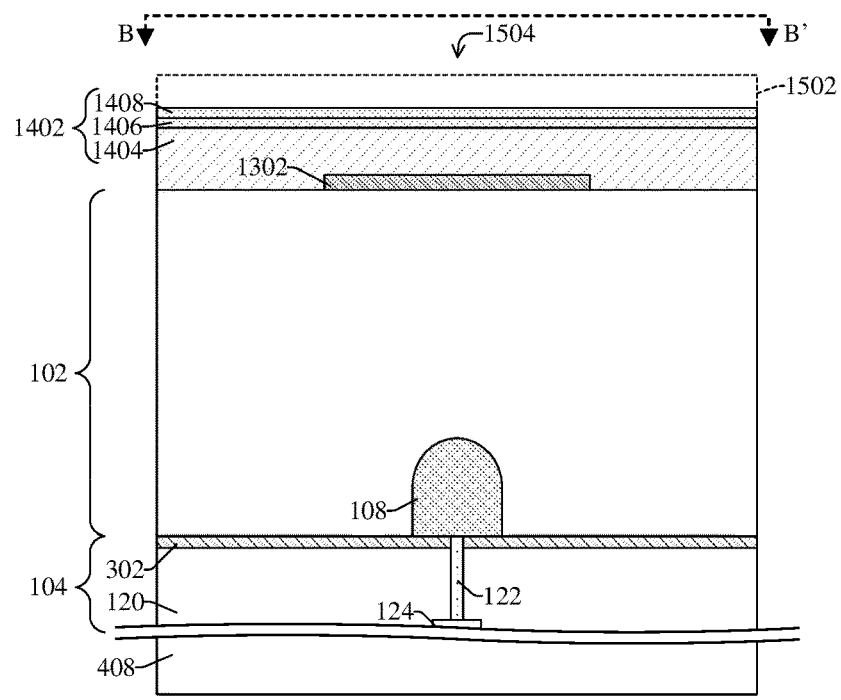

As shown in top view 1500a of FIG. 15A and cross-sectional views 1500b-1500c of FIGS. 15B-15C taken respectively along lines A-A' and B-B' in the top view 1500a, in some embodiments, a photoresist 1502 is formed over the upper dielectric structure 1402. In various embodiments, the photoresist 1502 is formed such that the photoresist 1502 comprises sidewalls defining a plurality of openings 1504 over the upper dielectric structure 1402. In various embodiments, as illustrated in the cross-sectional view 1500*b* of FIG. 15B, a width of one or more of the openings 1504 is less than widths of corresponding underlying hard mask components of the hard mask structure 1302.

Figure 16A:
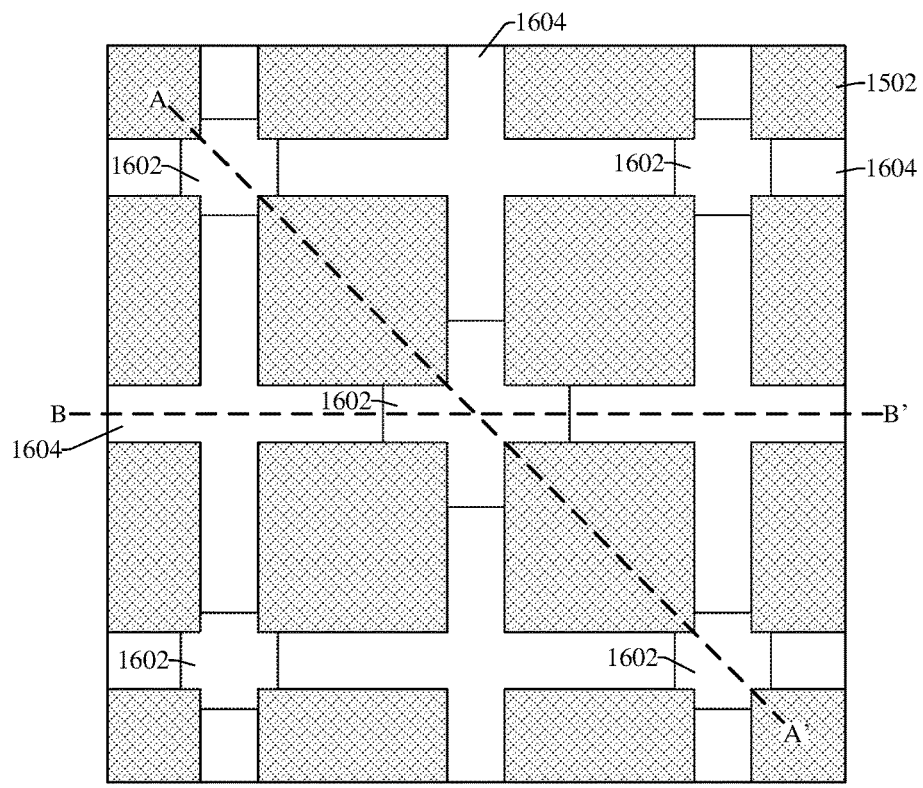
Figure 16B:
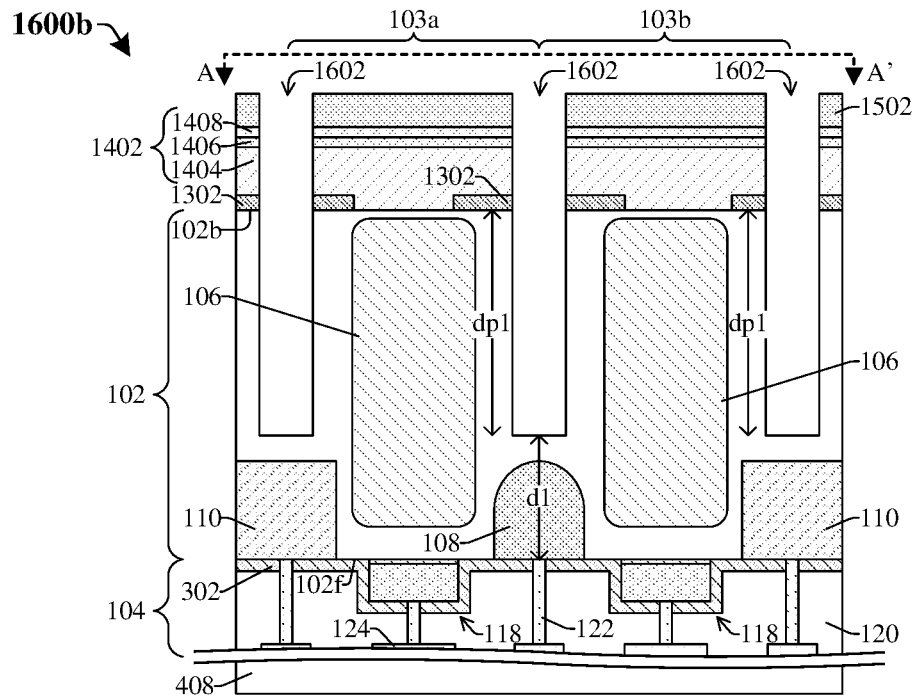
Figure 16C:
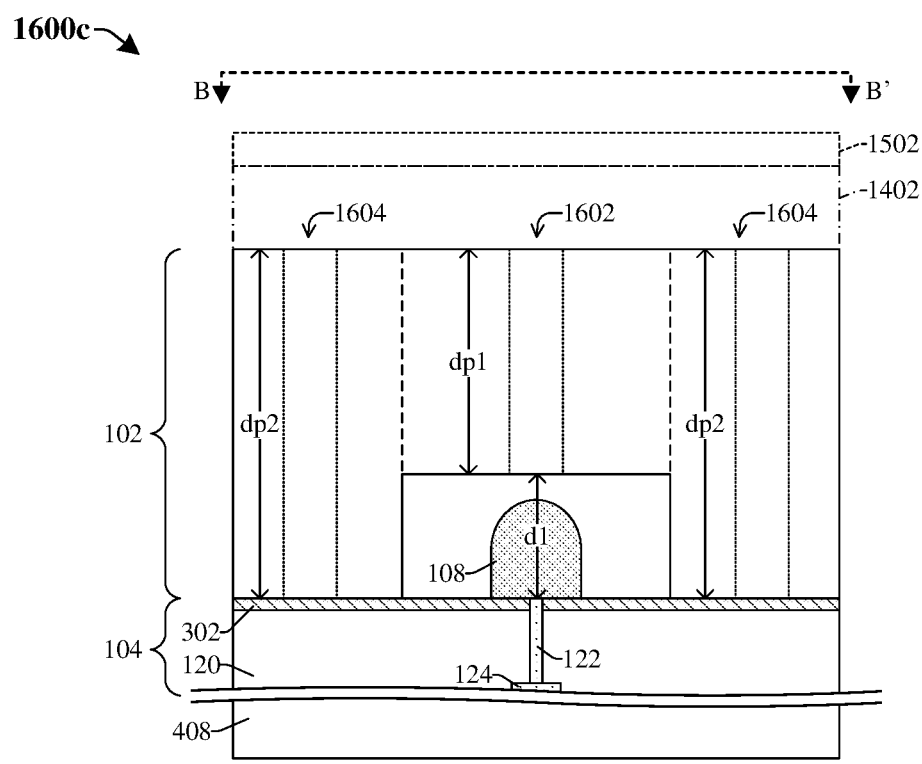

As shown in top view 1600*a* of FIG. 16A and cross-sectional views 1600*b*-1600*c* of FIGS. 16B-16C taken respectively along lines A-A' and B-B' in the top view 1600*a*, in some embodiments, an etching process is performed on the substrate 102 to form an isolation structure trench comprising a plurality of first components 1602 having a first depth dp1 and a plurality of second components 1604 having a second depth dp2. In various embodiments, the substrate 102 is etch more quickly than the hard mask structure 1302 during the etching process, such that the first depth dp1 is less than the second depth dep2. In some embodiments, an etch rate ratio of the substrate 102 and the hard mask structure 1302 is within a range of about 2:1 to 15:1, or another suitable value. In further embodiments, a thickness of the hard mask structure 1302 may be determined based on the etch rate ratio of the substrate 102 and the hard mask structure 1302 during the etching process utilized to form the isolation structure trench. In various embodiments, the etching process may be a dry etch process, a wet etch process, or a combination of the foregoing. By virtue of the hard mask structure 1302 being etched more slowly than the substrate 102 during the etching process, deepening of the first components 1602 of the isolation structure trench is reduced by the hard mask structure 1302. This, in part, results in the first depth dp1 being less than the second depth dp2, thereby preventing damage to the floating diffusion node 108 and/or the well regions 110 during the etching process.

Figure 17A:
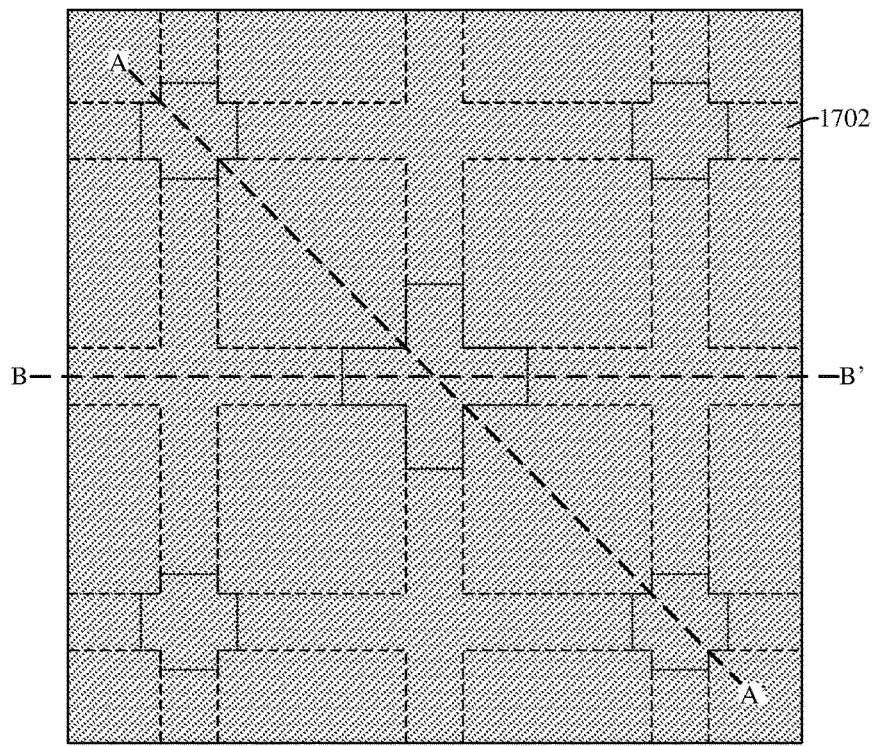
Figure 17B:
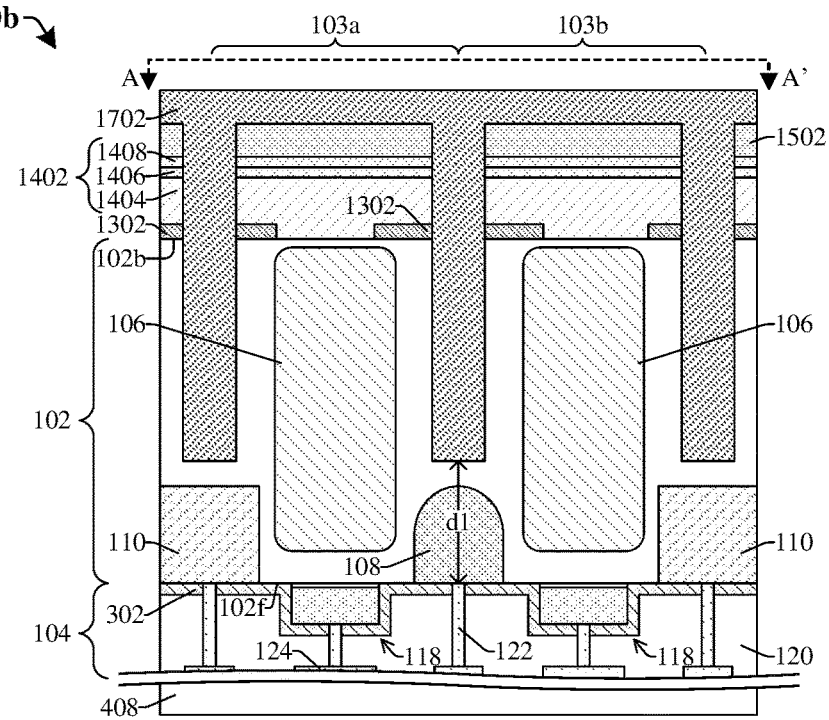
Figure 17C:
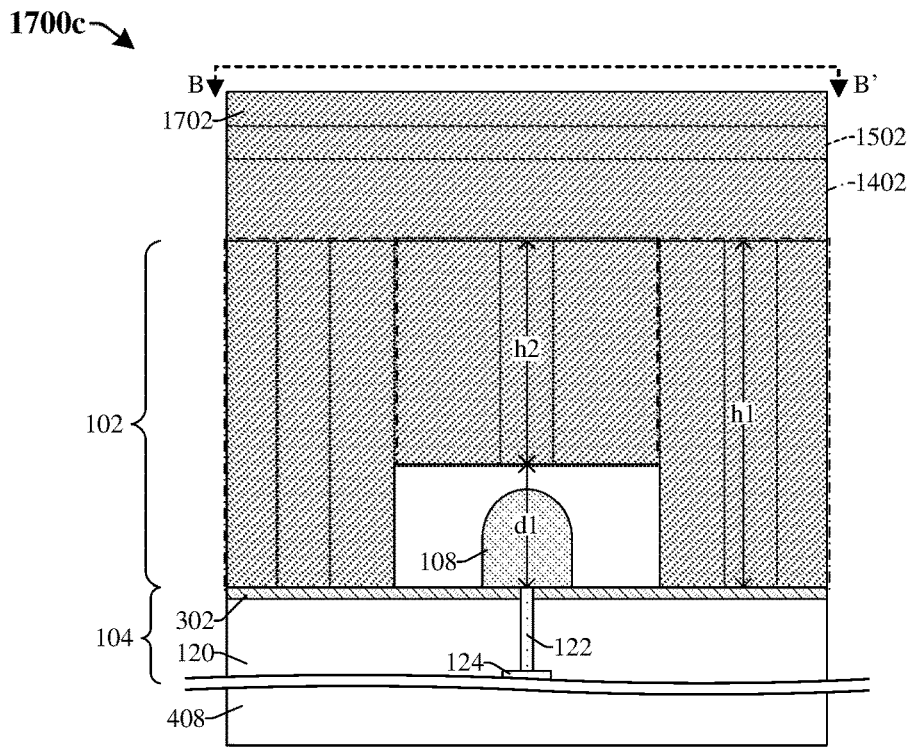

As shown in top view 1700*a* of FIG. 17A and cross-sectional views 1700*b*-1700*c* of FIGS. 17B-17C taken respectively along lines A-A' and B-B' in the top view 1700*a*, in some embodiments, a trench fill material 1702 is formed over and/or within the substrate 102. In various embodiments, the trench fill material 1702 may be formed by a CVD process, a PVD process, an ALD process, a sputtering process, an electroplating process, or some other suitable growth or deposition process.

Figure 18A:
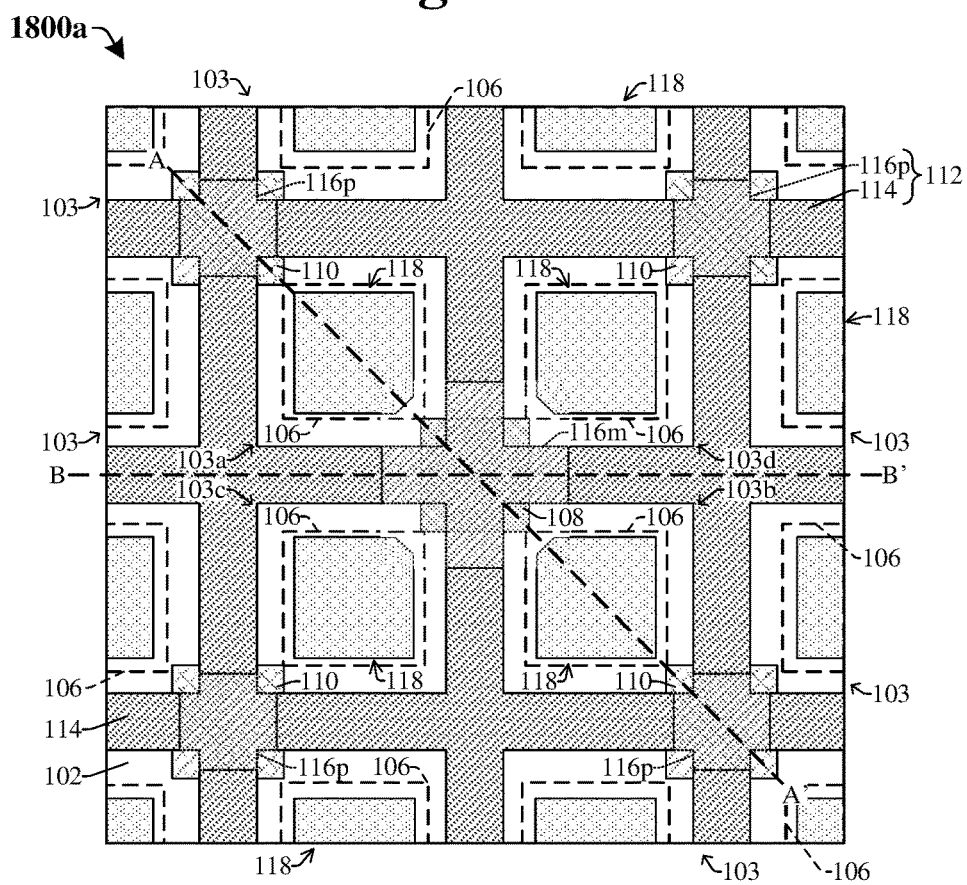

As shown in top view 1800*a* of FIG. 18A and cross-sectional views 1800*b*-1800*c* of FIGS. 18B-18C taken respectively along lines A-A' and B-B' in the top view 1800*a*, in some embodiments, a planarization process is performed on the trench fill material (1702 of FIGS. 17A-17C), thereby defining the isolation structure 112 that comprises a plurality of elongated isolation components 114, a middle isolation component 116*m*, and multiple peripheral isolation components 116*p*. In various embodiments, the plurality of short isolation components 116*m*, 116*p* comprises a middle isolation component 116*m* arranged at a crossroad of the pixel regions 103*a*-*d* and multiple peripheral isolation components 116*p* aligned with the plurality of well regions 110. In various embodiments, by arranging the hard mask structure (1302 of FIGS. 17A-17C) before forming the photoresist (1502 of FIGS. 17A-17C), the elongated, middle, and peripheral isolation components 114, 116*m*, 116*p* of the isolation structure 112 can be formed by a single photolithography process. As a result, overlapping and misalignment issues are mitigated and damage to the floating diffusion node 108 and the well regions 110 are reduced.

Figure 19A:
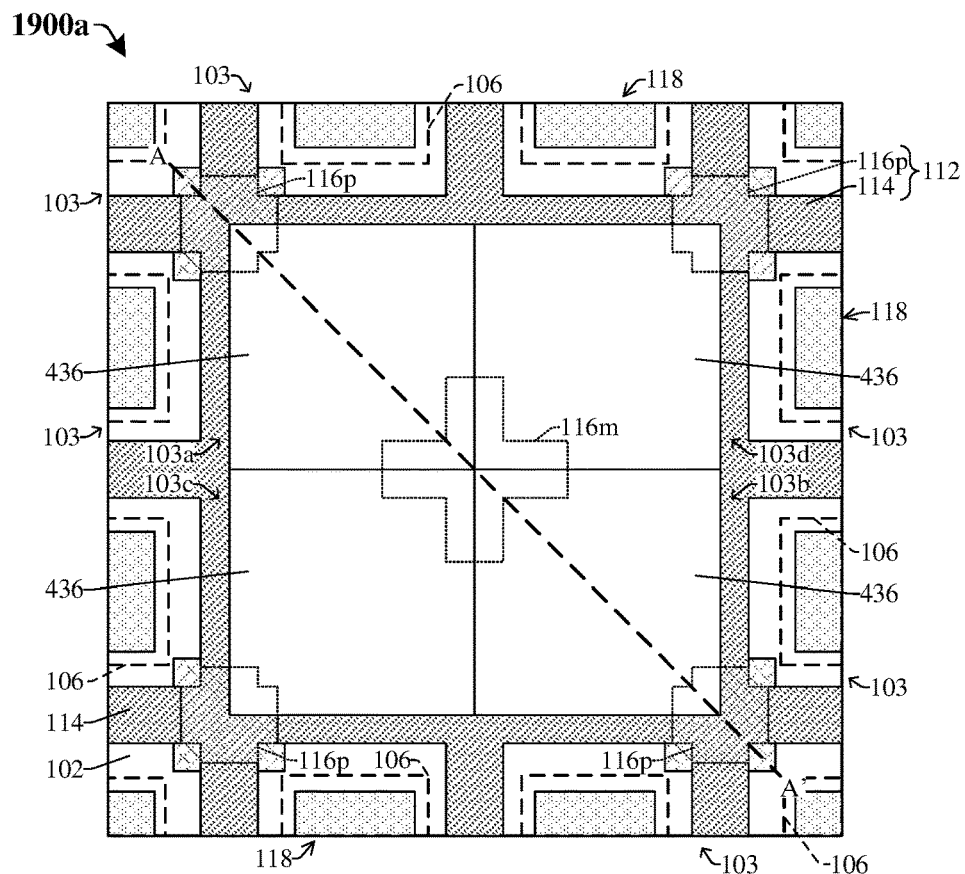
Figure 19B:
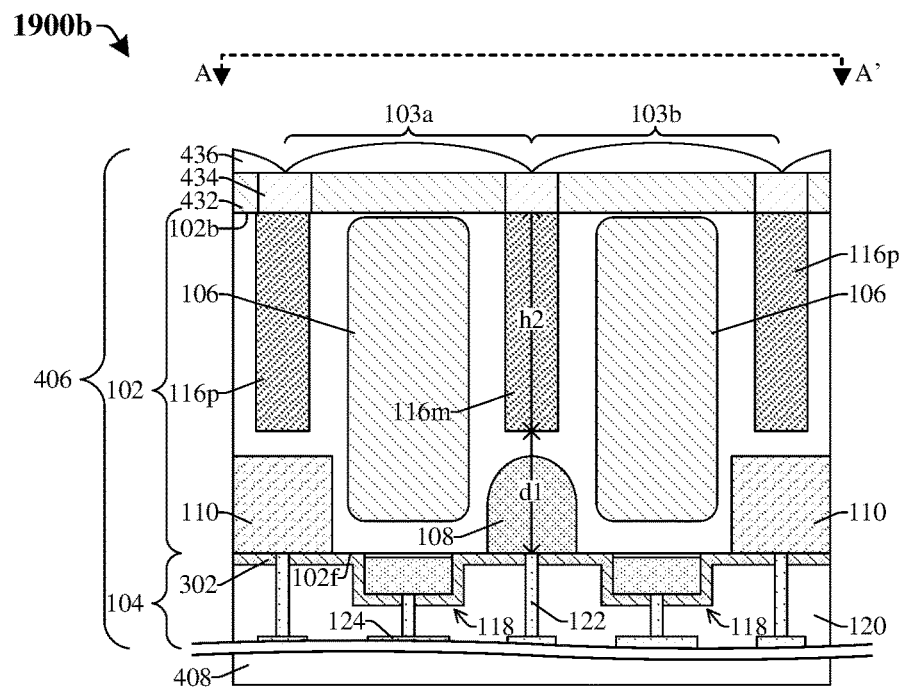

As shown in top view 1900*a* of FIG. 19A and cross-sectional view 1900*b* of FIG. 19B taken along line A-A' in the top view 1900*a*, in some embodiments, a grid structure 434, a plurality of light filters 432, and a plurality of micro-lenses 436 are formed over the back-side surface 102*b* of the substrate 102. For ease of illustration, the light filters 432, the grid structure 434, and the micro-lenses 436 are shown over the pixel regions 103*a*-*d* in FIG. 19A and are omitted from other regions over the substrate 102. The grid structure 434 directly overlies the isolation structure 112 and may be formed by depositing a grid material over the substrate 102 and patterning the grid material to form the grid structure 434. The light filters 432 may be formed by depositing and patterning respective color filter layers corresponding to the plurality of light filters 432. In various embodiments, the micro-lenses 436 may be formed by depositing a micro-lens material over the light filters 432 and patterning the micro-lens material to form the plurality of micro-lenses 436.

Figure 20:
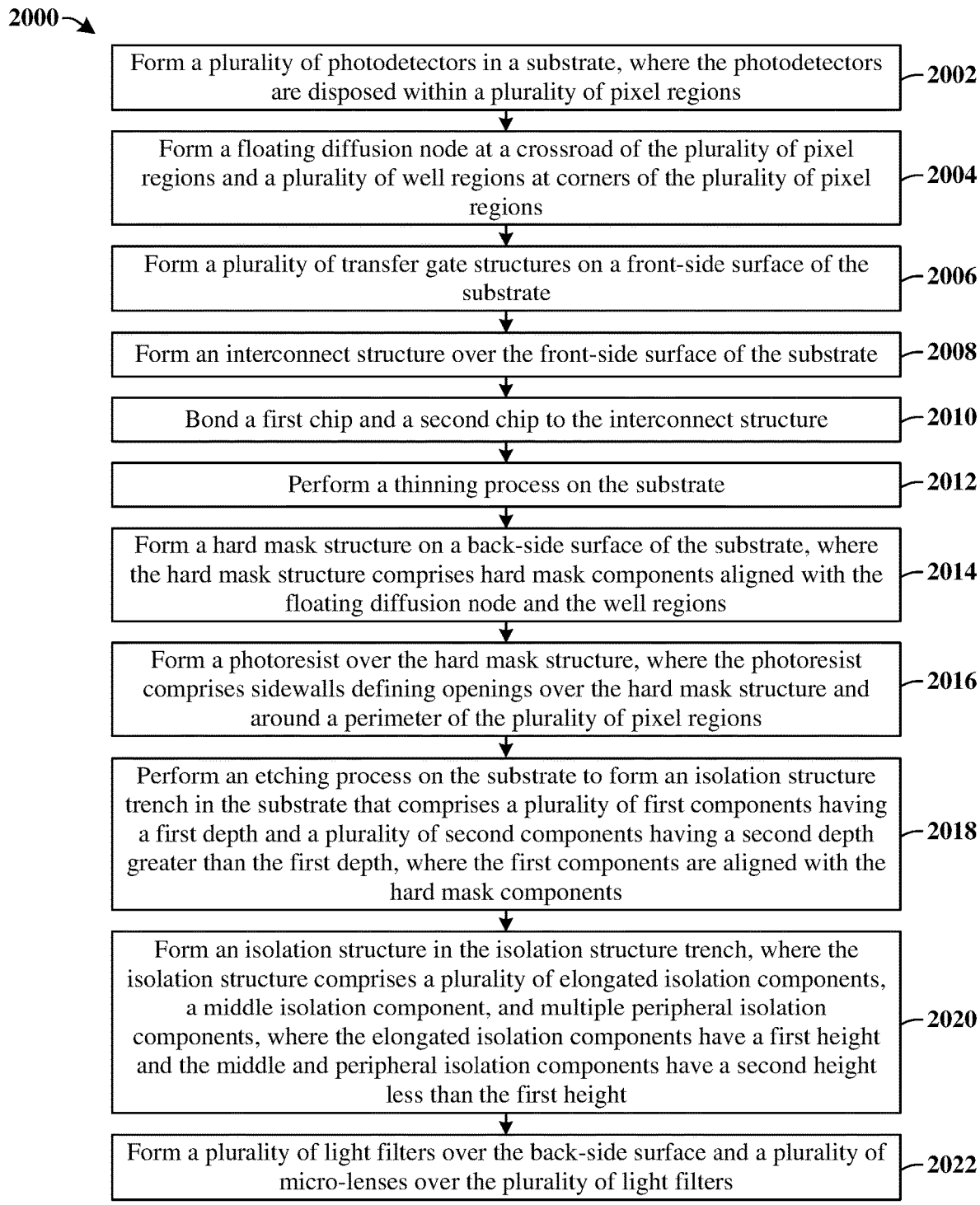
FIG. 20 illustrates a flowchart according to some embodiments of a method for forming an image sensor comprising a plurality of well regions and a plurality of pixel regions separated by an isolation structure having a plurality of isolation components.

FIG. 20 illustrates some embodiments of a method 2000 for forming an image sensor comprising a plurality of well regions and a plurality of pixel regions separated by an isolation structure having a plurality of isolation components. Although the method 2000 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 2002, a plurality of photodetectors is formed in a substrate, where the photodetectors are disposed within a plurality of pixel regions. FIG. 5 illustrates a cross-sectional view 500 corresponding to some embodiments of act 2002.

At act 2004, a floating diffusion node is formed at a crossroad of the plurality of pixel regions and a plurality of well regions are formed at corners of the plurality of pixel regions. FIG. 6 illustrates a cross-sectional view 600 corresponding to some embodiments of act 2004.

At act 2006, a plurality of transfer gate structures is formed on a front-side surface of the substrate. FIG. 7 illustrates a cross-sectional view 700 corresponding to some embodiments of act 2006.

At act 2008, an interconnect structure is formed over the front-side surface of the substrate. FIG. 8 illustrates a cross-sectional view 800 corresponding to some embodiments of act 2008.

At act 2010, a first chip and a second chip are bonded to the interconnect structure. FIGS. 9-11 illustrate cross-sectional views 900-1100 corresponding to some embodiments of act 2010.

At act 2012, a thinning process is performed on the substrate. FIG. 12 illustrates a cross-sectional view 1200 corresponding to some embodiments of act 2012.

At act 2014, a hard mask structure is formed on a back-side surface of the substrate, where the had mask layer comprises hard mask components aligned with the floating diffusion node and the well regions. FIGS. 13A-13C illustrate various views corresponding to some embodiments of act 2014.

At act 2016, a photoresist is formed over the hard mask structure, where the photoresist comprises sidewalls defining openings over the hard mask structure and around a perimeter of the plurality of pixel regions. FIGS. 15A-15C illustrate various views corresponding to some embodiments of act 2016.

At act 2018, an etching process is performed on the substrate to form an isolation structure trench in the substrate that comprises a plurality of first components having a first depth and a plurality of second components having a second depth greater than the first depth. The first components are aligned with the hard mask components. FIGS. 16A-16C illustrate various views corresponding to some embodiments of act 2018.

At act 2020, an isolation structure is formed within the isolation structure trench, where the isolation structure comprises a plurality of elongated isolation components, a middle isolation component, and multiple peripheral isolation components. The elongated isolation components have a first height and the middle and peripheral isolation components have a second height less than the first height. FIGS. 17A-17C and 18A-18C illustrate various views corresponding to some embodiments of act 2020.

At act 2022, a plurality of light filters is formed over the back-side surface and a plurality of micro-lenses is formed over the plurality of light filters. FIGS. 19A-19B illustrate various views corresponding to some embodiments of act 2022.

In some embodiments, it will be appreciated that the method of FIGS. 5-19B may alternating proceed from FIGS. 5-8 to FIGS. 12-19B (i.e., skipping FIGS. 9-11). In such embodiments, the first chip (402 of FIG. 12) and the second chip (404 of FIG. 12) are omitted and the thinning process of FIG. 12 may be performed immediately after forming the interconnect structure (104 of FIG. 8) over the substrate (102 of FIG. 8).

Figure 21:
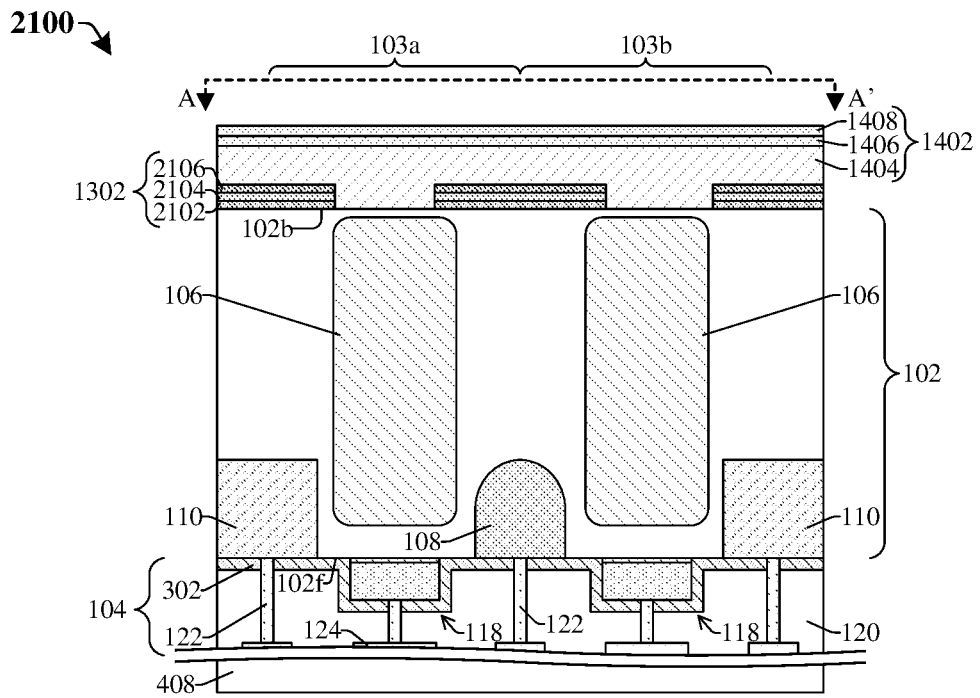
FIGS. 21-23 illustrate cross-sectional views of some other embodiments of a method for forming an image sensor comprising a plurality of well regions and a plurality of pixel regions separated by an isolation structure having a plurality of isolation components
Figure 22:
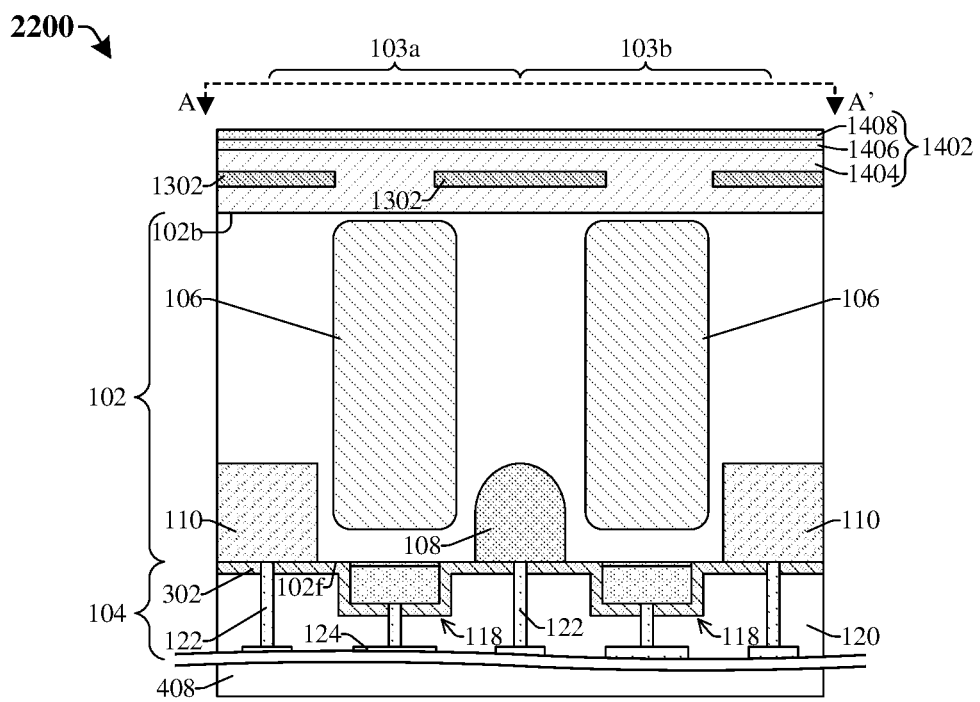
Figure 23:
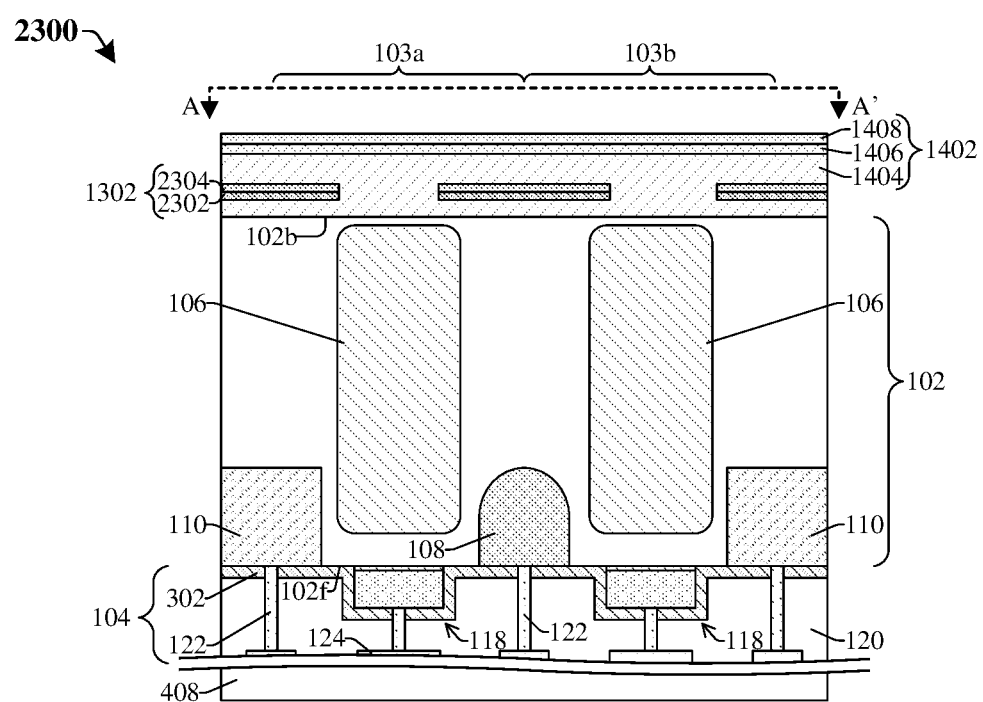

With reference to FIGS. 21-23, cross-sectional views 2100-2300 illustrate alternative acts that may be performed in place of the acts at FIGS. 13A-C and 14A-C. In an embodiment, the method of FIGS. 5-19B may alternatively proceed from FIGS. 5-12 to FIG. 21 and then from FIG. 21 to FIGS. 15A-19B (i.e., skipping acts FIGS. 13A-C and 14A-C). In another embodiment, the method of FIGS. 5-19B may alternatively proceed from FIGS. 5-12 to FIG. 22 and then from FIG. 22 to FIGS. 15A-19B (i.e., skipping acts FIGS. 13A-C and 14A-C). In yet another embodiment, the method of FIGS. 5-19B may alternatively proceed from FIGS. 5-12 to FIG. 23 and then from FIG. 23 to FIGS. 15A-19B (i.e., skipping acts FIGS. 13A-C and 14A-C).

As shown in cross-sectional view 2100 of FIG. 21, a hard mask structure 1302 and an upper dielectric structure 1402 are formed on the back-side surface 102b of the substrate 102. In various embodiments, the hard mask structure 1302 comprises a multi-layer stack of hard mask layers. For example, the hard mask structure 1302 may comprise a first hard mask layer 2102, a second hard mask layer 2104, and a third hard mask layer 2106. The first hard mask layer 2102 is disposed on the substrate 102, the second hard mask layer 2104 is disposed on the first hard mask layer 2102, and the third hard mask layer 2106 is disposed on the second hard mask layer 2104. In various embodiments, the first, second, and third hard mask layers 2102-2106 comprise a same material (e.g., an oxide, a nitride, etc.). In further embodiments, the first hard mask layer 2102 comprises a first material (e.g., silicon dioxide), the second hard mask layer 2104 comprises a second material (e.g., silicon nitride), and the third hard mask layer 2106 comprises a third material (e.g., silicon carbide, where the first material, the second material, and the third material are different from one another. By virtue of the hard mask structure 1302 comprising the multi-layer stack, the etch rate of the hard mask structure 1302 may be properly set for the etching process of FIGS. 16A-16C to ensure the first components (1602 of FIGS. 16A-16C) have the first depth dp1. In various embodiments, the hard mask structure 1302 comprises hard mask components (e.g., as illustrated in the top view 1300a of FIG. 13A) that respectively overlie the floating diffusion node 108 and the well regions 110.

As shown in cross-sectional view 2200 of FIG. 22, a hard mask structure 1302 and an upper dielectric structure 1402 are formed on the back-side surface 102b of the substrate 102. In some embodiments, the hard mask structure 1302 comprises a single hard mask layer. Further, the upper dielectric structure 1402 comprises a first dielectric layer 1404, a second dielectric layer 1406, and a third dielectric layer 1408, where the hard mask structure 1302 is embedded in the first dielectric layer 1404 and is vertically offset the back-side surface 102b of the substrate 102. In various embodiments, the hard mask structure 1302 comprises hard mask components (e.g., as illustrated in the top view 1300a of FIG. 13A) that respectively overlie the floating diffusion node 108 and the well regions 110.

As shown in cross-sectional view 2300 of FIG. 23, a hard mask structure 1302 and an upper dielectric structure 1402 are formed on the back-side surface 102b of the substrate 102. In various embodiments, the hard mask structure 1302 comprises a multi-layer stack of hard mask layers. For example, the hard mask structure 1302 may comprise a first hard mask layer 2302 and a second hard mask layer 2304. In various embodiments, the first and second hard mask layers 2302-2304 comprise a same material (e.g., an oxide, a nitride, etc.). In further embodiments, the first hard mask layer 2302 comprises a first material (e.g., silicon dioxide) and the second hard mask layer 2304 comprises a second material (e.g., silicon nitride) different from the first material. By virtue of the hard mask structure 1302 comprising the multi-layer stack, the etch rate of the hard mask structure 1302 may be properly set for the etching process of FIGS. 16A-16C to ensure the first components (1602 of FIGS. 16A-16C) have the first depth dp1. In various embodiments, the hard mask structure 1302 comprises hard mask components (e.g., as illustrated in the top view 1300a of FIG. 13A) that respectively overlie the floating diffusion node 108 and the well regions 110. Further, the upper dielectric structure 1402 comprises a first dielectric layer 1404, a second dielectric layer 1406, and a third dielectric layer 1408, where the hard mask structure 1302 is embedded in the first dielectric layer 1404 and is vertically offset the back-side surface 102b of the substrate 102.

Accordingly, in some embodiments, the present disclosure relates to an image sensor comprising a plurality of pixel regions disposed in a substrate, a floating diffusion node arranged at a crossroad of the plurality of pixel regions, and a plurality of well regions diagonally opposite edges of the floating diffusion node. Further, an isolation structure is disposed in the substrate and comprises a plurality of elongated isolation components, a middle isolation component disposed at the crossroad, and peripheral isolation components aligned with the well regions. The elongated isolation components have a first height and the middle and peripheral isolation components have a second height less than the first height.

In some embodiments, the present application provides an image sensor including: a plurality of photodetectors disposed within a substrate, wherein the photodetectors are disposed respectively within a plurality of pixel regions; a floating diffusion node disposed along a front-side surface of the substrate at a center of the plurality of pixel regions; a plurality of well regions disposed within the substrate at corners of the plurality of pixel regions; and an isolation structure extending into a back-side surface of the substrate, wherein the isolation structure comprises a plurality of elongated isolation components disposed between adjacent pixel regions, a middle isolation component aligned with the floating diffusion node, and multiple peripheral isolation components aligned with the plurality of well regions, wherein the elongated isolation components have a first height and the middle and peripheral isolation components have a second height less than the first height. In an embodiment, the well regions are respectively separated from the floating diffusion node by a corresponding photodetector in the plurality of photodetectors. In an embodiment, the image sensor further includes: a plurality of conductive ground vias directly overlying and electrically coupled to the well regions. In an embodiment, the isolation structure, the floating diffusion node, and the plurality of well regions have rotational symmetry of at least order four. In an embodiment, from a top view the middle isolation component and the peripheral isolation components respectively have a cross shape, wherein when from a cross-sectional view the middle isolation component and the peripheral isolation components respectively have a rectangular shape. In an embodiment, the well regions have a first doping type, the photodetectors have a second doping type, and the floating diffusion node has the second doping type, wherein the first doping type is opposite the second doping type, and wherein doping concentrations of the floating diffusion node and the well regions are greater than doping concentrations of the photodetectors. In an embodiment, the image sensor further includes: a plurality of gate structures overlying the pixel regions, wherein a minimum distance between the floating diffusion node and a closest well region in the plurality of well regions is greater than a width of an individual gate structure in the plurality of gate structures. In an embodiment, the plurality of gate structures respectively comprises a gate body disposed on the front-side surface and a gate protrusion extending into the front-side surface, wherein the gate protrusion is disposed directly laterally between the floating diffusion node and the plurality of well regions. In an embodiment, a distance between the front-side surface of the substrate and the middle isolation component is greater than a height of the floating diffusion node. In an embodiment, a width and a length of the middle isolation component is greater than a width and a length of an individual peripheral isolation component in the multiple peripheral isolation components.

In some embodiments, the present application provides an image sensor including: a plurality of pixel regions disposed within a substrate; a plurality of transfer gate structures disposed on a front-side surface of the substrate, wherein the transfer gate structures are disposed respectively within the plurality of pixel regions; a floating diffusion node disposed in the substrate at a center of the plurality of pixel regions; a plurality of well regions disposed in the substrate, wherein the well regions are respectively diagonally opposite a corresponding edge of the floating diffusion node; and an isolation structure extending into a back-side surface of the substrate and laterally between the plurality of pixel regions, wherein the isolation structure comprises a middle isolation component arranged with the floating diffusion node, multiple peripheral isolation components arranged with the well regions, and a plurality of elongated isolation components extending laterally between the middle isolation component and the peripheral isolation components, wherein a first depth of the elongated isolation components is greater than a second depth of the middle and peripheral isolation components. In an embodiment, a minimum distance between the floating diffusion node and the well regions is greater than a diagonal length of the floating diffusion node.

In an embodiment, the image sensor further includes: an etch stop layer disposed on the front-side surface of the substrate, wherein the elongated isolation components directly contact the etch stop layer, wherein the middle and peripheral isolation components are vertically offset from the etch stop layer. In an embodiment, a length of the middle isolation component is equal to a length of the floating diffusion node and a width of the middle isolation component is equal to a width of the floating diffusion node. In an embodiment, a first elongated isolation component in the plurality of elongated isolation components comprises a first sidewall aligned with a sidewall of a first peripheral isolation component in the multiple peripheral isolation components, and wherein the first elongated isolation component comprises a second sidewall aligned with a sidewall of the middle isolation component and orthogonal to the first sidewall.

In some embodiments, the present application provides a method for forming an image sensor, the method includes: forming a plurality of photodetectors within a substrate, wherein the photodetectors are disposed respectively within a plurality of pixel regions; doping the substrate to form a floating diffusion node at a center of the plurality of pixel regions and a plurality of well regions diagonally opposite edges of the floating diffusion node; forming a hard mask structure on a back-side surface of the substrate, wherein the hard mask structure comprises a first hard mask component aligned with the floating diffusion node and a plurality of second hard mask components aligned with the well regions; performing an etch process on the substrate with the hard mask structure in place to form an isolation structure trench within the substrate, wherein the isolation structure trench comprises a plurality of first components having a first depth and a plurality of second components having a second depth greater than the first depth, wherein the first components are aligned with the floating diffusion node and the well regions; and forming an isolation structure in the isolation structure trench, wherein the isolation structure comprises a middle isolation component and multiple peripheral isolation components having the first depth and a plurality of elongated isolation components having the second depth. In an embodiment, forming the isolation structure includes: depositing a trench fill layer in the isolation structure trench, wherein the trench fill layer contacts sidewalls of the hard mask structure; and performing a planarization process on the trench fill layer and the hard mask structure. In an embodiment, a width of the first hard mask component is greater than widths of the second hard mask components. In an embodiment, the second hard mask components are respectively laterally offset from the first hard mask component by a corresponding photodetector in the plurality of photodetectors. In an embodiment, the hard mask structure comprises a first hard mask layer and a second hard mask layer overlying the first hard mask layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming an image sensor, the method comprising:
   forming a plurality of photodetectors within a substrate, wherein the photodetectors are disposed respectively within a plurality of pixel regions;
   doping the substrate to form a floating diffusion node at a crossroad of the plurality of pixel regions and a plurality of well regions diagonally opposite edges of the floating diffusion node;
   forming a hard mask structure on a back-side surface of the substrate, wherein the hard mask structure comprises a first hard mask component aligned with the floating diffusion node and a plurality of second hard mask components aligned with the well regions;
   performing an etch process on the substrate with the hard mask structure in place to form an isolation structure trench within the substrate, wherein the isolation structure trench comprises a plurality of first components having a first depth and a plurality of second components having a second depth greater than the first depth, wherein the first components are aligned with the floating diffusion node and the well regions; and
   forming an isolation structure in the isolation structure trench, wherein the isolation structure comprises a middle isolation component and multiple peripheral isolation components having the first depth and a plurality of elongated isolation components having the second depth.

2. The method of claim 1, wherein forming the isolation structure comprises:
   depositing a trench fill layer in the isolation structure trench, wherein the trench fill layer contacts sidewalls of the hard mask structure; and
   performing a planarization process on the trench fill layer and the hard mask structure.

3. The method of claim 1, wherein a width of the first hard mask component is greater than widths of the second hard mask components.

4. The method of claim 1, wherein the second hard mask components are respectively laterally offset from the first hard mask component by a corresponding photodetector in the plurality of photodetectors.

5. The method of claim 1, wherein the hard mask structure comprises a first hard mask layer and a second hard mask layer overlying the first hard mask layer.

6. The method of claim 1, wherein during the etch process the substrate has a first etch rate and the hard mask structure has a second etch rate less than the first etch rate.

7. The method of claim 6, wherein a ratio of the first etch rate and the second etch rate is within a range of about 2:1 to 15:1.

8. The method of claim 1, further comprising:
   depositing an etch stop layer on a front-side surface of the substrate, wherein the plurality of elongated isolation components continuously vertically extend from the back-side surface of the substrate to the etch stop layer.

9. The method of claim 1, wherein the plurality of first components and the plurality of second components of the isolation structure trench are formed concurrently with one another.

10. A method for forming an image sensor, the method comprising:
    forming a plurality of photodetectors in a first substrate and disposed respectively within a plurality of pixel regions, wherein the first substrate comprises a first surface vertically offset a second surface;
    doping the first substrate to form a floating diffusion node along the first surface of the first substrate and at a middle region of the plurality of pixel regions;
    doping the first substrate to form a plurality of well regions along the first surface of the first substrate and at corners of the plurality of pixel regions;
    forming a first interconnect structure on the first surface of the first substrate, wherein the first interconnect structure and the first substrate are part of a first integrated circuit chip;
    bonding a second integrated circuit chip to the first interconnect structure;
    performing an etch process on the second surface of the first substrate to form an isolation structure trench in the first substrate and around the plurality of photodetectors; and
    forming an isolation structure in the isolation structure trench, wherein the isolation structure comprises a first isolation component over the floating diffusion node, a plurality of peripheral isolation components over the plurality of well regions, and a plurality of elongated isolation components between the first isolation component and the plurality of peripheral isolation components, wherein the elongated isolation components have a first height and the first isolation component and the peripheral isolation components have a second height less than the first height.

11. The method of claim 10, wherein a width of the first isolation component is greater than a width of an individual peripheral isolation component in the plurality of peripheral isolation components.

12. The method of claim 11, wherein a width of an individual elongated isolation component in the plurality of elongated isolation components abutting the first isolation component is greater than the width of the first isolation component.

13. The method of claim 10, wherein the second integrated circuit chip comprises a second substrate and a second interconnect structure on a first surface of the second substrate, wherein a bonding interface is arranged between the first interconnect structure and the second interconnect structure, wherein the method further comprises:
    forming a plurality of through substrate vias (TSVs) into a second surface of the second substrate;
    forming a bond structure on the plurality of TSVs; and
    bonding a third integrated circuit chip to the bond structure, wherein the etching process is performed after bonding the third integrated circuit chip to the bond structure.

14. The method of claim 10, further comprising:
    forming a grid structure over the second surface of the first substrate, wherein the grid structure is laterally aligned with the isolation structure.

15. The method of claim 10, wherein the plurality of well regions comprise a first doping type and the floating diffusion node comprises a second doping type opposite the first doping type.

16. The method of claim 10, wherein a minimum distance between the floating diffusion node and a closest well region in the plurality of well regions is greater than a width of the first isolation component.

17. A method for forming an image sensor, the method comprising:
    forming a plurality of photodetectors in a substrate, wherein the substrate comprises a first surface vertically offset a second surface;

forming a floating diffusion node in the substrate at a crossroad of the plurality of photodetectors;

forming a plurality of well regions in the substrate, wherein the well regions are respectively diagonally opposite a corresponding edge of the floating diffusion node; and forming an isolation structure in the substrate and around the plurality of photodetectors, wherein the isolation structure is disposed between adjacent photodetectors in the plurality of the photodetectors and extends vertically from the second surface of the substrate towards the first surface of the substrate, wherein the isolation structure comprises a first isolation component over the floating diffusion node, a plurality of peripheral isolation components over the plurality of well regions, and a plurality of elongated isolation components, wherein bottom surfaces of the elongated isolation components are vertically below bottom surfaces of the first and peripheral isolation components.

18. The method of claim 17, further comprising:

forming a plurality of gate structures on the first surface of the substrate, wherein the plurality of gate structures are respectively spaced laterally between the first isolation component and a corresponding well region in the plurality of well regions.

19. The method of claim 17, wherein the bottom surface of the first isolation component is vertically offset a top of the floating diffusion node.

20. The method of claim 17, wherein forming the isolation structure comprises:

forming a hard mask structure on the second surface of the substrate, wherein the hard mask structure comprises a plurality of hard mask components laterally aligned with the first and peripheral isolation components;

forming a dielectric structure over the hard mask structure;

forming a photoresist over the dielectric structure, wherein the photoresist comprises sidewalls defining openings over the plurality of hard mask components;

performing an etch process on the substrate with the hard mask structure and the photoresist in place, thereby defining a trench in the substrate;

depositing an isolation structure material in the trench; and performing a planarization process on the isolation structure material.

* * * * *